(12) United States Patent
Yasunaga et al.

(10) Patent No.: US 9,337,129 B2
(45) Date of Patent: May 10, 2016

(54) SEMICONDUCTOR DEVICE AND METHOD OF MANUFACTURING THE SAME

(71) Applicant: ROHM CO., LTD., Kyoto (JP)

(72) Inventors: Koji Yasunaga, Kyoto (JP); Shingo Takaki, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 14/226,280

(22) Filed: Mar. 26, 2014

(65) Prior Publication Data

US 2014/0291828 A1 Oct. 2, 2014

(30) Foreign Application Priority Data

Mar. 27, 2013 (JP) .................. 2013-065628

(51) Int. Cl.
*H01L 21/00* (2006.01)
*H01L 23/495* (2006.01)
*H01L 23/00* (2006.01)
(Continued)

(52) U.S. Cl.
CPC .... *H01L 23/49541* (2013.01); *H01L 23/49524* (2013.01); *H01L 23/49548* (2013.01); *H01L 23/49551* (2013.01); *H01L 23/49555* (2013.01); *H01L 24/37* (2013.01); *H01L 24/40* (2013.01); *H01L 24/84* (2013.01); *H01L 21/561* (2013.01); *H01L 23/3107* (2013.01); *H01L 23/49503* (2013.01); *H01L 23/49562* (2013.01); *H01L 24/83* (2013.01); *H01L 2224/04034* (2013.01); *H01L 2224/05571* (2013.01); *H01L 2224/05644* (2013.01); *H01L 2224/291* (2013.01); *H01L 2224/32245* (2013.01); *H01L 2224/37005* (2013.01); *H01L 2224/37012* (2013.01); *H01L 2224/40106* (2013.01); *H01L 2224/40245* (2013.01); *H01L 2224/40496* (2013.01); *H01L 2224/40499* (2013.01); *H01L 2224/73263* (2013.01); *H01L 2224/83192* (2013.01); *H01L 2224/84047* (2013.01); *H01L 2224/84801* (2013.01); *H01L 2224/92246* (2013.01); *H01L 2924/181* (2013.01); *H01L 2924/3841* (2013.01)

(58) Field of Classification Search
CPC ............ H01L 21/561; H01L 23/49503; H01L 23/49524; H01L 23/49541; H01L 23/49548; H01L 23/49551; H01L 23/49555; H01L 23/49562; H01L 24/83
USPC ........................................................ 257/676
See application file for complete search history.

(56) References Cited

U.S. PATENT DOCUMENTS 3,735,208 A * 5/1973 Roswell ................. H01L 23/045
257/682
4,891,333 A * 1/1990 Baba .................. B23K 20/2333
219/148

(Continued)

FOREIGN PATENT DOCUMENTS

JP 2012-182253 9/2012

*Primary Examiner* — Nicholas Tobergte
(74) *Attorney, Agent, or Firm* — Hamre, Schumann, Mueller & Larson, P.C.

(57) ABSTRACT

A semiconductor device includes: a semiconductor element having an electrode facing a first direction; a first lead having a conductive distal end surface facing the electrode, and a rising portion which is connected to the distal end surface to extend away from the electrode; a conductive bonding material bonding the electrode of the semiconductor element to the distal end surface of the first lead; and a sealing resin covering the semiconductor element, at least a portion of the first lead, and the conductive bonding material.

25 Claims, 20 Drawing Sheets

(51) Int. Cl.
 *H01L 23/31* (2006.01)
 *H01L 21/56* (2006.01)

(56) References Cited

U.S. PATENT DOCUMENTS

| | | | | |
|---|---|---|---|---|
| 5,625,223 | A * | 4/1997 | Sunada | H01L 21/565 257/678 |
| 5,714,405 | A * | 2/1998 | Tsubosaki | H01L 23/3107 257/E23.039 |
| 5,757,066 | A * | 5/1998 | Inoue | H01L 21/565 257/666 |
| 5,776,802 | A * | 7/1998 | Ochi | H01L 23/49503 257/E23.037 |
| 5,834,842 | A * | 11/1998 | Majumdar | H01L 23/3107 257/675 |
| 6,043,430 | A * | 3/2000 | Chun | H01L 23/3107 174/530 |
| 6,091,139 | A * | 7/2000 | Adachi | H01L 21/56 257/666 |
| 6,476,495 | B2 * | 11/2002 | Konishi | H01L 23/4824 257/341 |
| 7,274,088 | B2 * | 9/2007 | Wu | H01L 23/4951 257/673 |
| 8,227,107 | B2 * | 7/2012 | Akou | H01M 2/263 429/121 |
| 2002/0101132 | A1 * | 8/2002 | Sugimori | H03H 9/0528 310/321 |
| 2004/0135244 | A1 * | 7/2004 | Yamazaki | H01L 23/24 257/695 |
| 2007/0176266 | A1 * | 8/2007 | Kawano | H01L 23/49524 257/622 |
| 2009/0215230 | A1 * | 8/2009 | Muto | H01L 21/565 438/124 |
| 2011/0115062 | A1 * | 5/2011 | Yokoe | H01L 23/49524 257/676 |
| 2014/0124912 | A1 * | 5/2014 | Kaneda | H01L 24/49 257/676 |
| 2014/0217569 | A1 * | 8/2014 | Ishibashi | H01L 23/50 257/685 |
| 2014/0284809 | A1 * | 9/2014 | Yoneguchi | H01L 24/13 257/773 |

* cited by examiner

FIG. 13
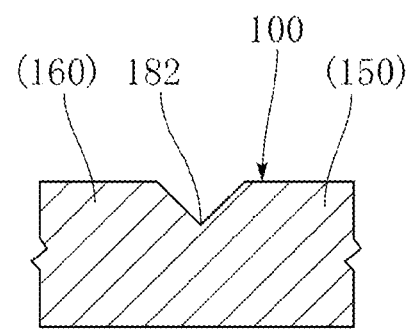
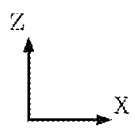

FIG. 19
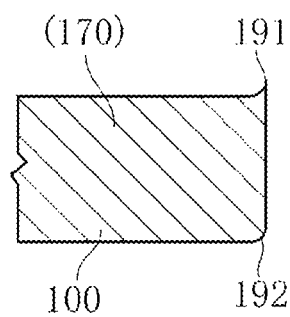
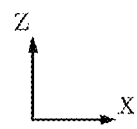
FIG. 20
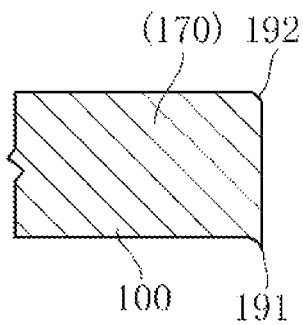

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2013-065628, filed on Mar. 27, 2013, the entire contents of which are incorporated herein by reference.

TECHNICAL FIELD

The present disclosure relates to a semiconductor device and a method of manufacturing the semiconductor device.

BACKGROUND

A semiconductor device including a semiconductor element, a lead making electrical connection to the semiconductor element, and a sealing resin covering a portion of the semiconductor element and the lead is widely used. An example of the semiconductor element may include a diode and a transistor. The semiconductor element may include an upper electrode and a lower electrode. In addition, two leads may be disposed with the semiconductor element interposed therebetween. In this case, one of the two leads makes electrical connection to the upper electrode and the other makes electrical connection to the lower electrode. The two leads and the upper and lower electrodes are bonded together by solder. When viewed from the top, the two leads are sized to cover most or all of the upper and lower electrodes.

The solder is formed, for example, by softening a solder paste through heating and then curing the solder paste. Through the heating and curing process, the semiconductor element is interposed between the two leads. In this case, if the semiconductor element is largely misaligned, for example, the solder paste may move to a side of the semiconductor element beyond the upper electrode, this may cause a problem of improper electrical connection of the leads to a conductive portion exposed on the side of the semiconductor element.

SUMMARY

The present disclosure provides some embodiments of a semiconductor device which is capable of bonding electrodes of a semiconductor element with leads more reliably, and a method of manufacturing the semiconductor device.

According to one embodiment of the present disclosure, there is provided a semiconductor device including: a semiconductor element having an electrode facing a first direction; a first lead having a conductive distal end surface facing the electrode, and a rising portion which is connected to the distal end surface to extend away from the electrode; a conductive bonding material bonding the electrode of the semiconductor element to the distal end surface of the first lead; and a sealing resin covering the semiconductor element, at least a portion of the first lead, and the conductive bonding material.

The distal end surface may be smaller than the electrode of the semiconductor element when viewed from the first direction.

The distal end surface may overlap with a center of the electrode of the semiconductor element.

The conductive bonding material may be contained in the electrode when viewed from the first direction.

An outline of the semiconductor element may be similar to that of the electrode.

The distal end surface may have a rectangular shape.

The first lead may be connected to the rising portion and have a transverse portion extending to be spaced from the rising portion when viewed from the first direction.

A distance between the transverse portion and the electrode of the semiconductor element in the first direction may be larger than a distance between the transverse portion and an outer surface of the sealing resin.

The first lead may have a stepped portion having one end connected to the transverse portion in an opposite side to the rising portion and the other end located nearer to the semiconductor element in the first direction than the one end.

The first lead may have a first extending portion which is connected to the stepped portion and extends to be spaced away from the stepped portion when viewed from the first direction, and the first extending portion has a portion protruding from the sealing resin.

The first lead may have a first bypass portion having one end connected to the first extending portion in an opposite side to the stepped portion and the other end located at a position spaced from the stepped portion in the first direction below the one end.

The first lead may have a first groove which is formed in a first bent portion connecting the first extending portion and the first bypass portion and extends in a bending direction of the first bent portion, with the first groove located in an inner side of the first bent portion.

The first groove may be shorter than the first bent portion in the bending direction.

The first lead may have a first terminal portion connected to the first bypass portion.

The transverse portion may have an equal width portion whose width of one side connected to the rising portion is equal to the width of the rising portion.

The transverse portion may have an extended width portion which is connected to the equal width portion in an opposite side to the rising portion and is wider than the equal width portion.

The transverse portion may have an equal width portion whose width of one side connected to the rising portion is equal to the width of the rising portion and an extended width portion which is connected to the equal width portion in an opposite side to the rising portion and is wider than the equal width portion, and the first extending portion may be wider than the extended width portion.

The rising portion may be inclined with respect to the first direction, and a burr may be formed in a portion of the distal end surface in an opposite side to a direction to which the rising portion is inclined.

The semiconductor device may further include a second lead having a die pad portion bonded to the semiconductor element from an opposite side to the distal end surface of the first lead.

The semiconductor device may further include a second extending portion which is connected to the die pad portion and extends to an outside of the sealing resin when viewed from the first direction.

The second extending portion of the second lead may be located such that a portion connected to the die pad portion is farther spaced from the distal end surface of the first lead in the first direction than a portion protruding from the sealing resin.

The second extending portion may have a width that is narrower than that of the die pad portion.

The second lead may have a second bypass portion having one end connected to the second extending portion in an opposite side to the die pad portion and the other end located at a position spaced from the second extending portion in the first direction below the one end.

The second lead may have a second groove which is formed in a second bent portion connecting the second extending portion and the second bypass portion and extends in a bending direction of the second bent portion, with the second groove located in an inner side of the second bent portion.

The second groove may be shorter than the second bent portion in the bending direction.

The second lead may have a second terminal portion connected to the second bypass portion.

According to another embodiment of the present disclosure, there is provided a method of manufacturing a semiconductor device, including: preparing a semiconductor element having an electrode facing a first direction and a first lead having a distal end surface; arranging the first lead such that the distal end surface faces the electrode; and bonding the electrode to the distal end surface.

The act of arranging the first lead may include rotating the first lead into a position where the distal end surface faces the electrode, from a position where the distal end surface faces the same side as the electrode in the first direction.

The act of arranging the first lead may include rotating the first lead by twisting a connecting portion which is connected to the first lead and extends in an axial direction of the rotation, and the method may further include removing the connecting portion after performing the act of arranging the first lead.

The act of removing the connecting portion may be performed by punching.

With the above configurations, the first lead is bonded by the conductive bonding material in a position where only the distal end surface faces the electrode. Therefore, it is possible to prevent the softened conductive bonding material from spreading over an extended region between the electrode and the first lead in the process of manufacturing the semiconductor device. Thus, it is possible to prevent the first lead from being misaligned and prevent the conductive bonding material from extending to a side of the semiconductor element over the electrode. In addition, by providing the rising portion extending away from the electrode, it can be expected that the softened conductive bonding material rises along the rising portion. Thus, the conductive bonding material can stay in a vicinity of the rising portion. Accordingly, it is possible to bond the electrode of the semiconductor element to the first lead more reliably.

These and other features and advantages of the present disclosure will be more apparent from the following detailed description in conjunction with the accompanying drawings.

BRIEF DESCRIPTION OF THE DRAWINGS

FIG. 13 is an enlarged sectional view taken along line XIII-XIII in FIG. 8.

FIG. 19 is an enlarged sectional view taken along line XIX-XIX in FIG. 18.

FIG. 20 is an enlarged sectional view taken along line XX-XX in FIG. 18.

DETAILED DESCRIPTION

Figure 1:
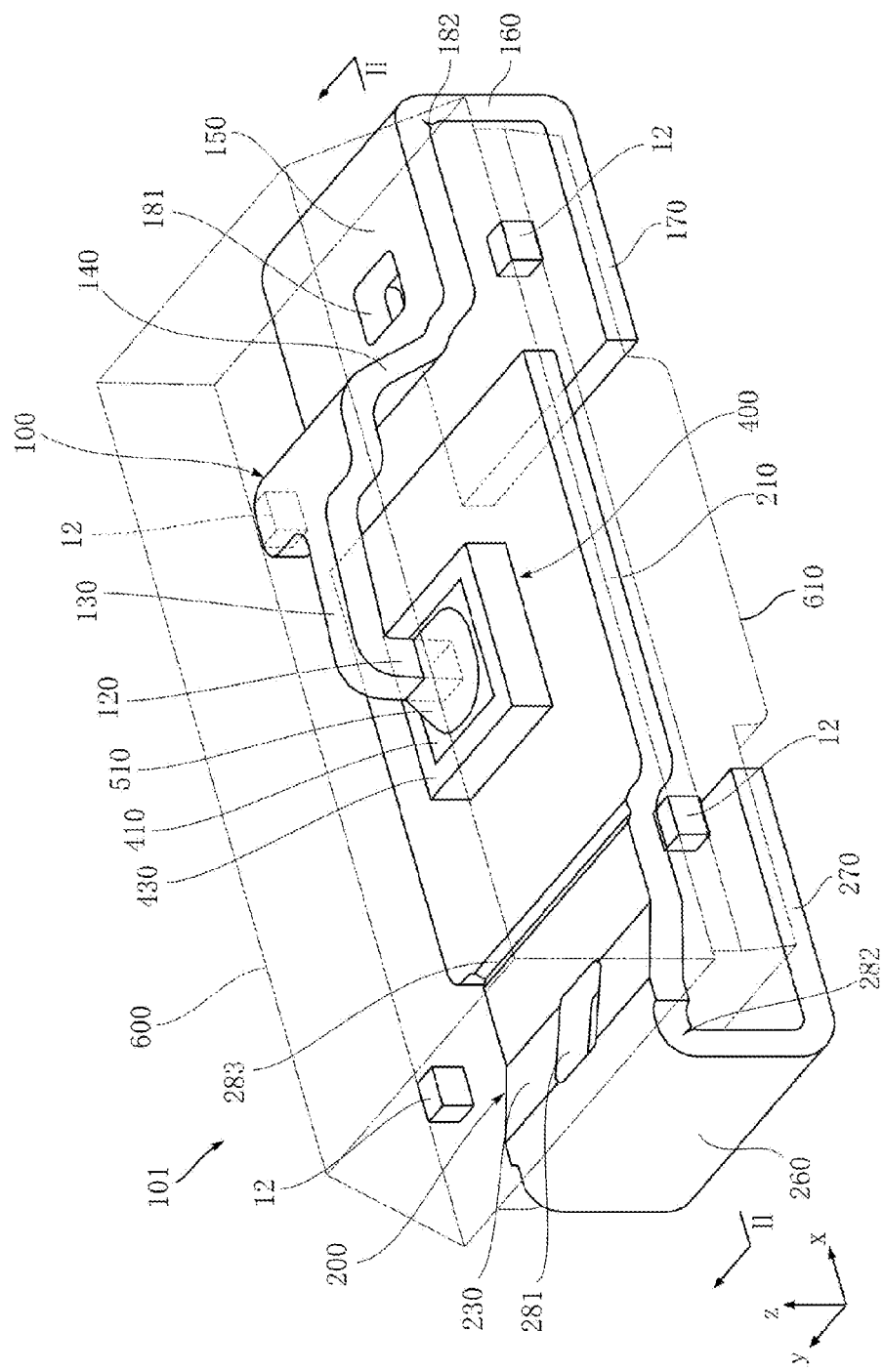
FIG. 1 is a perspective view illustrating a semiconductor device according to a first embodiment of the present disclosure.

Some embodiments of the present disclosure will now be described in detail with reference to the drawings.

FIGS. 1 to 6 illustrate a semiconductor device according to a first embodiment of the present disclosure. The semiconductor device 101 of this embodiment includes a first lead 100, a second lead 200, a semiconductor element 400, solders 510 and 520 and a sealing resin 600. The semiconductor device 101 is configured as a so-called two-terminal type sealing resin electronic component, which is merely one example of the semiconductor device of the present disclosure. The semiconductor device 101 may be a sealing resin electronic component having three or more terminals.

Figure 2:
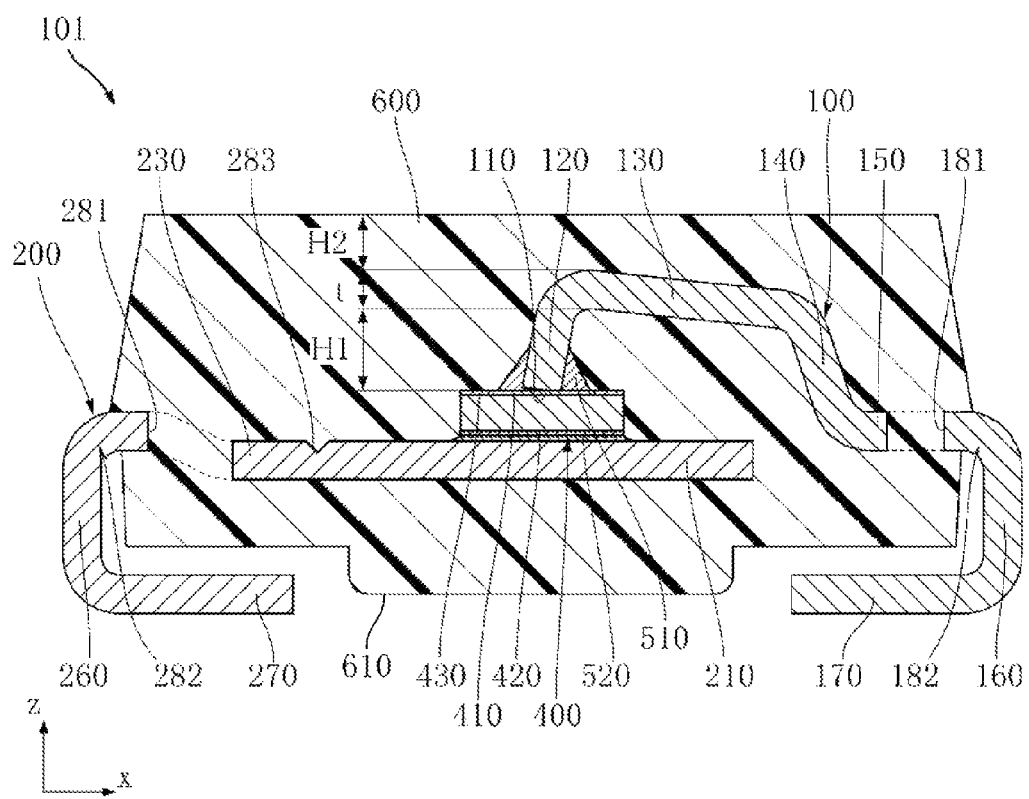
FIG. 2 is a sectional view taken along line II-II in FIG. 1.
Figure 3:
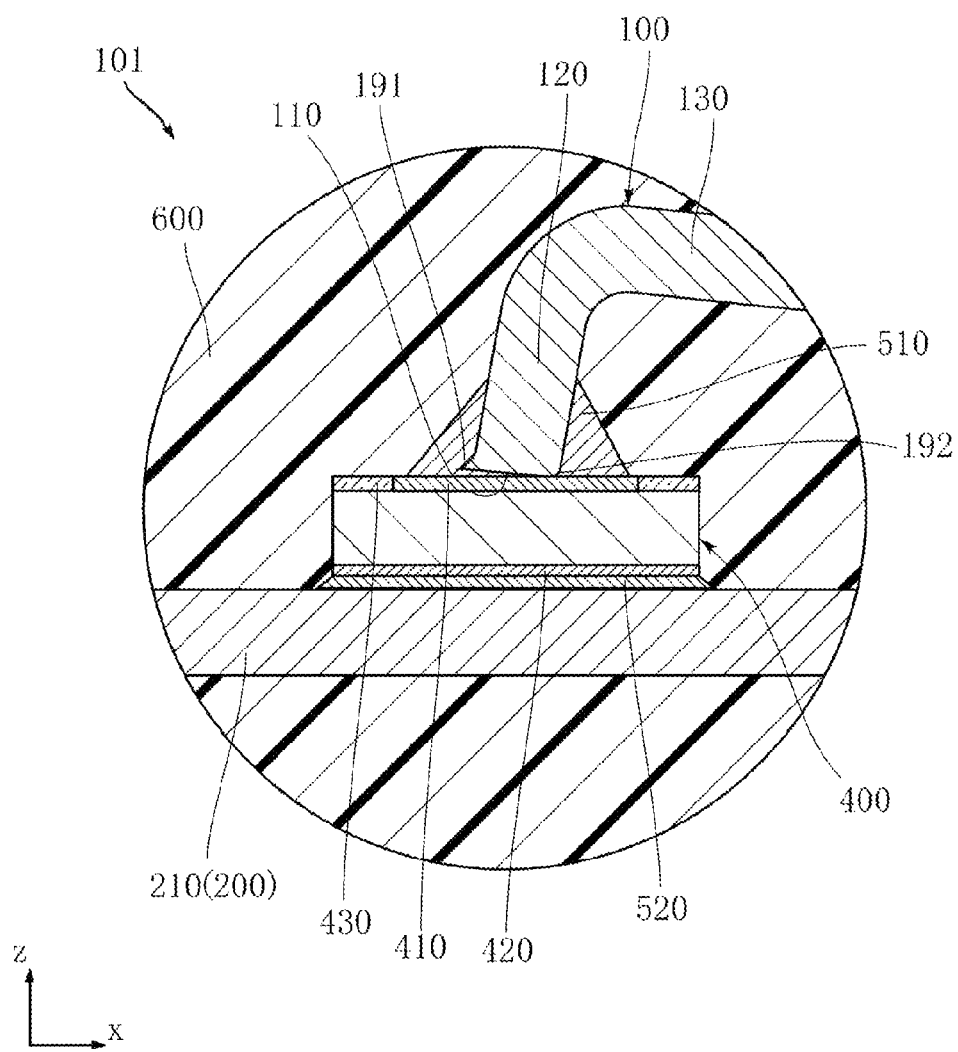
FIG. 3 is an enlarged sectional view illustrating a main part of the semiconductor device of FIG. 1.
Figure 4:
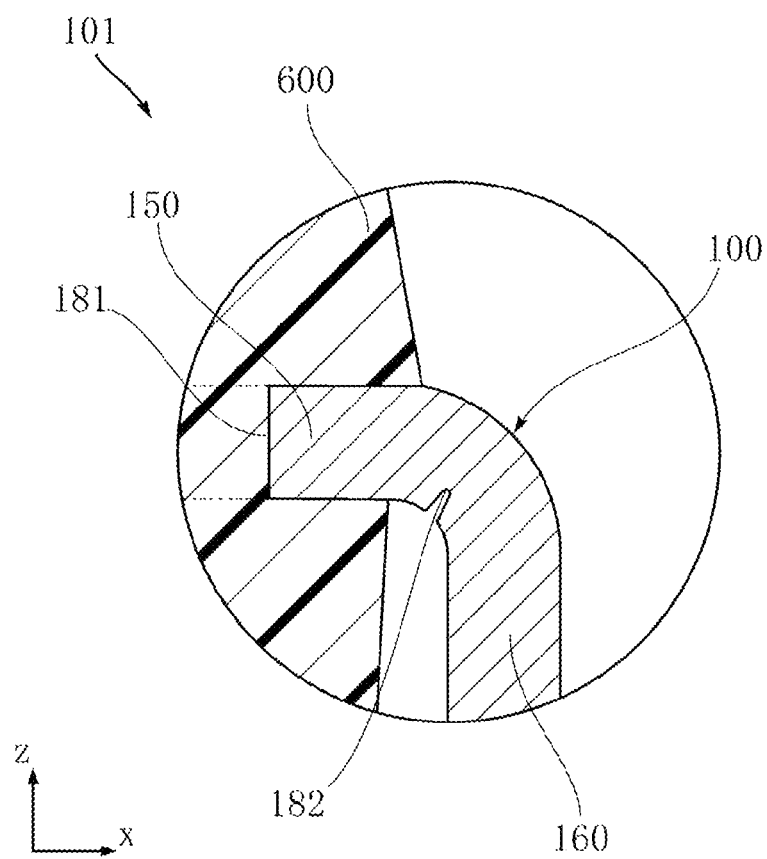
FIG. 4 is an enlarged sectional view illustrating a main part of the semiconductor device of FIG. 1.
Figure 5:
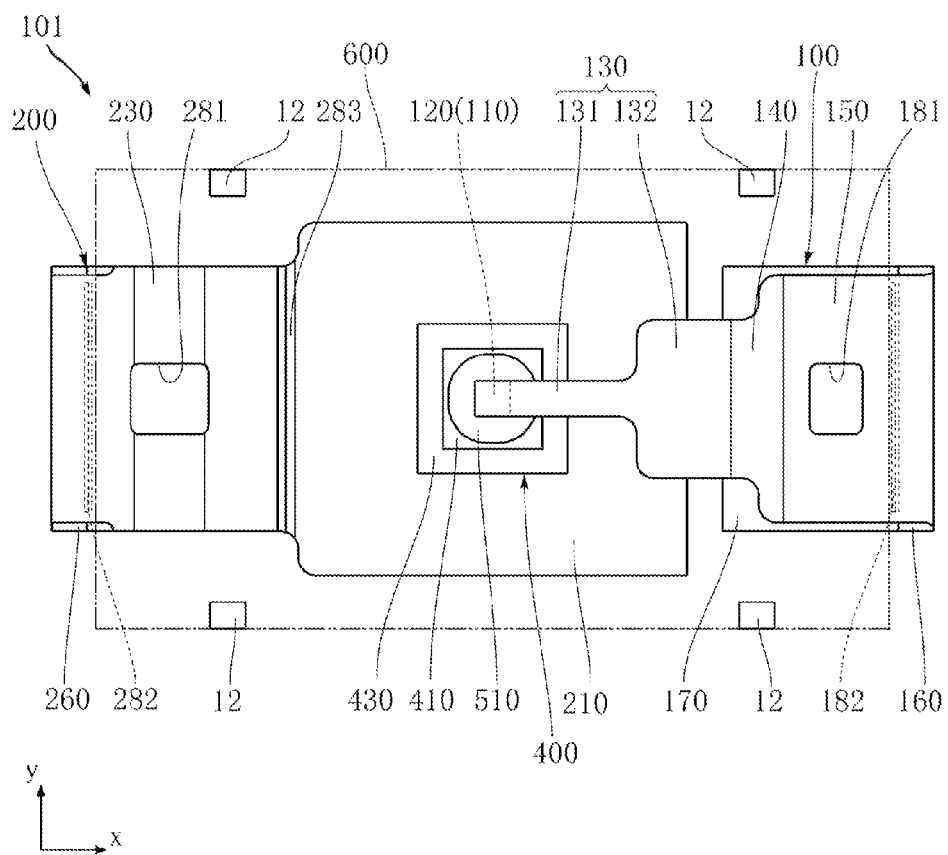
FIG. 5 is a plane view illustrating the semiconductor device of FIG. 1.
Figure 6:
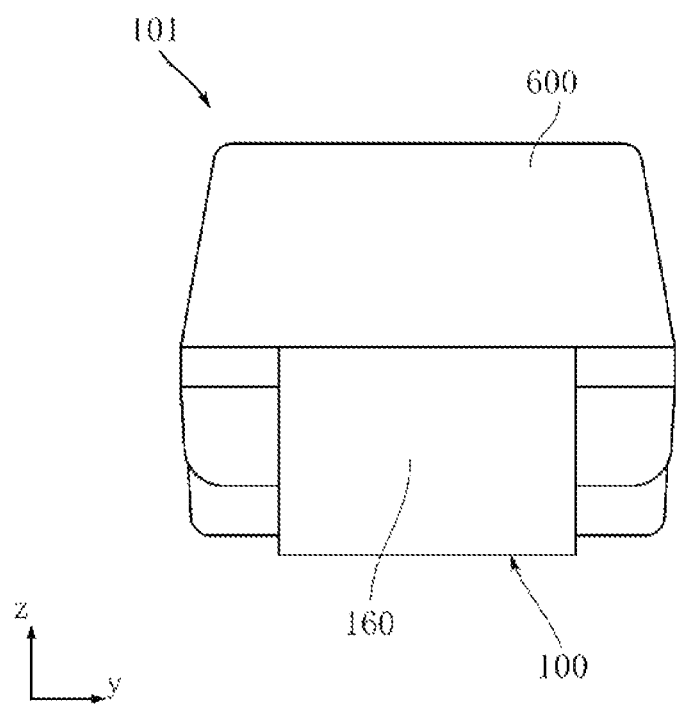
FIG. 6 is a side view illustrating the semiconductor device of FIG. 1.

FIG. 1 is a perspective view of the semiconductor device 101 according to the first embodiment of the present disclosure. FIG. 2 is a sectional view taken along line II-II in FIG. 1. FIGS. 3 and 4 are enlarged sectional views of the semiconductor device 101. FIG. 5 is a plane view of the semiconductor device 101 and FIG. 6 is a side view of the semiconductor device 101. In these figures, the z direction corresponds to a first direction recited in the present disclosure. In the following description, for the sake of convenience, an upper portion and a lower portion in FIGS. 1 to 3 are referred to as "top" and "bottom", respectively, but this is not intended to specify that the z direction coincides with the direction of gravity. The x and y directions are treated to define the planar directions.

As one example of the external size of the semiconductor device 101, the dimensions in x, y and z direction are about 5.0 mm, about 2.6 mm and about 2.0 mm, respectively.

The first lead 100 defines a conduction path of current to flow into the semiconductor element 400. In this embodiment, the first lead 100 is formed of a metal plate made of, for example, Cu. In this embodiment, the first lead 100 includes a distal end surface 110, a rising portion 120, a transverse portion 130, a stepped portion 140, a first extending portion 150, a first bypass portion 160 and a first terminal portion 170. The thickness of the first lead 100 is, for example, about 0.2 mm.

As illustrated in FIGS. 2 and 3, the distal end surface 110 faces the z direction (downward) in this embodiment, the distal end surface 110 is in the form of a square whose size is about 0.2 square mm (mm$^2$).

The rising portion 120 is connected to the distal end surface 110 and rises to be spaced away from an upper electrode 410 of the semiconductor element 400 which will be described later, in this embodiment, the rising portion 120 has a uniform sectional shape and size. The sectional shape of the rising portion 120 is in the form of a square whose size is about 0.2 mm square, like the distal end surface 110. The length of the rising portion 120 is, for example, about 0.6 mm.

As illustrated in FIG. 3, in this embodiment, the rising portion 120 is slightly inclined with respect to the z direction. Specifically, an upper portion of the rising portion is inclined toward a right side of the figure. Thus, the upper portion of the rising portion 120 is positioned on the right side with respect to the distal end surface 110. In addition, since the distal end surface 110 is perpendicular to the rising portion 120, the distal end surface 110 is inclined with respect to the x direction such that its left portion is higher in the x direction than its right portion. In the distal end surface 110, a first burr 191 is formed on its left side. In addition, a first sagging 192 is formed on the right side. The first burr 191 and the first sagging 192 may be formed when manufacturing the semiconductor device 101 as will be described in detail later. In the semiconductor device 101, both of the first burr 191 and the first sagging 192 may be formed, or one of them may be formed, or none of them may be formed.

The transverse portion 130 is connected to the rising portion 120 and extends to be spaced away from the rising portion 120 in the x direction. In this embodiment, as illustrated in FIGS. 1, 2 and 5, the transverse portion 130 extends from the rising portion 120 to a right side in the x direction. In this embodiment, the thickness of the transverse portion 130 in the z direction is about 0.2 mm. The transverse portion 130 has an equal width part 131 and an extended width part 132. The equal width part 131 is connected to the rising portion and is equal to the rising portion 120 in terms of y direction width. That is, the equal width part 131 is continuously connected to the rising portion 120 and its y direction width is, for example, about 0.2 mm. The extended width part 132 is connected to the opposite side (the right side in the x direction) to the rising portion 120 with respect to the equal width part 131 and is wider than the equal width part 131 in the y direction. The width of the extended width part 132 in the y direction is, for example, about 0.9 mm. The dimension of each of the equal width part 131 and the extended width part 132 in the x direction is, for example, about 0.5 mm. As illustrated in FIG. 2, in this embodiment, the transverse portion 130 is slightly inclined with respect to the x direction. This inclination angle is substantially equal to the inclination angle of the rising portion 120 with respect to the z direction.

The stepped portion 140 has one end connected to the transverse portion 130 on the opposite side (the right side in the figure) of the rising portion 120 and the other end being lower than the one end in the z direction toward the semiconductor element 400 (a lower side in the z direction). That is, the stepped portion 140 provides a crank-shaped portion to shift in the z direction in the first lead 100. In this embodiment, the stepped portion 140 is inclined with respect to the z direction. This inclination angle is slightly larger than the inclination angle of the rising portion 120 with respect to the z direction and the inclination angle of the transverse portion 130 with respect to the x direction. The stepped portion 140 is about 0.2 mm in thickness, about 1.4 mm in the y direction dimension and about 0.6 mm in z direction dimension.

The first extending portion 150 is connected to the lower side of the stepped portion 140 in the figure and extends in a direction away from the stepped portion 140 (to the right side in the figure) when viewed from the z direction. The first extending portion 150 partially projects from the sealing resin 600 to be described later. As illustrated in FIGS. 1 and 2, the first extending portion 150 is substantially parallel to the x direction. The first extending portion 150 is about 1.4 mm in y direction dimension and about 0.2 mm in z direction thickness. In this embodiment, a first opening 181 is formed in the first extending portion 150. The first opening 181 is arranged substantially in the center of the first extending portion 150 when viewed from the top. The first opening 181 has a rectangular shape of about 0.3 mm in x direction dimension and about 0.4 mm in y direction dimension.

The first bypass portion 160 has one end connected to the stepped portion 140 on the opposite side (the right side in the figure) of the first extending portion 150 and the other end which lies in a position lower than the stepped portion 140 in the z direction. In this embodiment, the first bypass portion 160 is about 1.5 mm in the y direction dimension and about 0.2 mm in thickness. In this embodiment, as illustrated in FIGS. 4 and 5, a first groove 182 is formed in a bent portion which is a portion connecting the first extending portion 150 and the first bypass portion 160. The first groove 182 extends in the y direction which is a bending direction in the bent portion. In the present disclosure, for the sake of convenience, the "bending direction" refers to a direction in which a bending line formed by a bending process extends. The first groove 182 is located in an inner side of the bent portion. As illustrated in FIG. 5, the y direction dimension of the first groove 182 is smaller than the y direction dimension of the bent portion and the first groove 182 does not reach both ends of the bent portion in the y direction. As will be described later, the first groove 182 is formed by bending a lead frame 10 (to be described later) in a position where a groove having a triangular sectional shape when viewed from the y direction is formed. Accordingly, the first groove 182 may have a somewhat closed shape rather than a somewhat opened shape. The depth of the first groove 182 is, for example, about 0.07 mm.

The first terminal portion 170 is connected to a bottom of the first bypass portion 160 in the z direction and extends from the bottom of the first bypass portion 160 to the left side in the x direction. The first terminal portion 170 is a portion used as a mounting terminal when the semiconductor device 101 is surface-mounted on, for example, a circuit board (not shown) or the like. In this embodiment, the first terminal portion 170 is, for example, about 1.5 mm in the y direction dimension and about 0.2 mm in thickness.

The second lead 200 defines a conduction path of current flowing into the semiconductor element 400, along with the first lead 100. In this embodiment, the second lead 200 is formed of a metal plate made of, for example, Cu. In this embodiment, the second lead 200 includes a die pad portion 210, a second extending portion 230, a second bypass portion 260 and a second terminal portion 270. The thickness of the second lead 200 is, for example, about 0.2 mm.

The die pad portion 210 is a portion on which the semiconductor element 400 is mounted. The die pad portion 210 is located below the distal end portion 110 of the first lead 100 in the z direction, with the semiconductor element 400 interposed therebetween. As illustrated in FIGS. 1 and 5, the die pad portion 210 is larger than the semiconductor element 400 when viewed from the z direction and has a rectangular shape of, for example, about 2.2 mm in the x direction dimension and about 2.3 mm in the y direction dimension. As illustrated in FIG. 2, in this embodiment, the die pad portion 210 is located below the first extending portion 150 of the first lead 100 in the z direction.

The second extending portion 230 is connected to the die pad portion 210 and extends to the outside of the sealing resin 600 toward the left side in the x direction when viewed from the z direction. The y direction dimension of the second extending portion 230 is, for example, about 1.5 mm, which is narrower than the y direction width of the die pad portion 210. In addition, as illustrated in FIG. 2, the second extending portion 230 has a portion connected to the die pad portion 210, which is farther spaced apart from the distal end surface 110 of the first lead 100 in the z direction than a portion projecting from the sealing resin 600, i.e., located below in the z direction. Specifically, the second extending portion 230 is formed in the form of a crank having two bent portions. A shift distance in the z direction due to the crank form is, for example, about 0.15 mm. In this embodiment, a second opening 281 is formed in the second extending portion 230. The second opening 281 is arranged substantially in the center of the second extending portion 230 when viewed from the top. The second opening 281 has a rectangular shape of about 0.4 mm in the x direction dimension and about 0.4 mm in y direction dimension.

The second bypass portion 260 has one end connected to the second extending portion 230 on the opposite side (the left side in the figure) of the die pad portion 210 and the other end which is lower than the one end in the z direction and lies in a position farther spaced than the second extending portion 230, i.e., located below in the z direction. In this embodiment, the second bypass portion 260 is about 1.5 mm in the y direction dimension. In this embodiment, like the first groove 182 described with reference to FIGS. 4 and 5, a second groove 282 is formed in a bent portion which is a portion connecting the second extending portion 230 and the second bypass portion 260. The second groove 282 extends in the y direction which is a bending direction in the bent portion. The second groove 282 is located in the inner side of the bent portion. As illustrated in FIG. 5, the y direction dimension of the second groove 282 is smaller than the y direction dimension of the bent portion and the second groove 282 does not reach both ends of the bent portion in the y direction. As will be described later, the second groove 282 is formed by bending a lead frame 10 (to be described later) in a position where as a result of a process of bending a groove having a triangular sectional shape when viewed from the y direction is formed. Accordingly, the second groove 282 may have a somewhat closed shape rather than a somewhat opened shape. The depth of the second groove 282 is, for example, about 0.07 mm.

In this embodiment, a third groove 283 is formed between the die pad portion 210 and the second extending portion 230. The third groove 283 extends in the y direction and is opened upward in the z direction. The sectional shape of the third groove 283 is substantially triangular or trapezoidal. The third groove 283 functions to prevent a solder 520 to be described later from being spread and thus increase the bonding strength between the second lead 200 and the sealing resin 600.

The second terminal portion 270 is connected to a bottom of the second bypass portion 260 in the z direction and extends from the bottom of the second bypass portion 260 to the left side in the x direction. The second terminal portion 270 is a portion used as a mounting terminal when the semiconductor device 101 is surface-mounted on, for example, a circuit board (not shown) or the like. In this embodiment, the second terminal portion 270 is, for example, about 1.5 mm in y direction dimension.

The semiconductor element 400 functions as one element of an electrical circuit (not shown) when the semiconductor device 101 is incorporated into the electrical circuit. In this embodiment, the semiconductor element 400 may be, for example, a diode. The semiconductor element 400 includes an upper electrode 410, a lower electrode 420 and an insulating layer 430. The semiconductor element 400 is, for example, about 0.9 mm to 1.70 mm in x direction dimension, about 0.90 mm to 1.70 mm in y direction dimension and about 0.26 mm in z direction height.

The upper electrode 410 corresponds to an electrode recited in the present disclosure. The upper electrode 410 is formed on an upper surface of the semiconductor element 400 in the z direction and faces upward in the z direction. The upper electrode 410 is formed of a metal plating layer made of, for example, Au. In this embodiment, as illustrated in FIGS. 1 and 5, the upper electrode 410 has a rectangular shape similar to the outline of the semiconductor element 400 when viewed from the top. The upper electrode 410 is recessed inwardly from the outer edge of the semiconductor element 400 when viewed from the top. The distal end surface 110 of the first lead 100 is smaller than the upper electrode 410. When viewed from the top, the center of the distal end surface 110 coincides substantially with the center of the upper electrode 410. The upper electrode 410 is, for example, about 0.60 mm to 1.40 mm in the x direction dimension and about 0.60 mm to 1.40 mm in the y direction dimension.

The upper electrode 410 and the distal end surface 110 of the first lead 100 are bonded together by the solder 510. The solder 510 corresponds to one example of a conductive bonding material recited in the present disclosure. As illustrated in FIGS. 1, 2 and 5, the solder 510 is contained in the upper electrode 410 when viewed from the z direction. That is, the outer edge of the solder 510 is recessed inwardly from the outer edge of the upper electrode 410. The solder 510 is formed so as to climb up a portion of the rising portion 120 of the first lead 100. The climbing height of the solder 510 is about half of the height of the rising portion 120.

The insulating layer 430 is made of, for example, $SiO_2$ and surrounds the upper electrode 410. The outer edge of the insulating layer 430 reaches the outer edge of the semiconductor element 400 when viewed from the z direction. In this embodiment, the insulating layer 430 has an annular rectangular shape.

The lower electrode 420 is formed on a lower surface of the semiconductor element 400 in the z direction and faces downward in the z direction. The lower electrode 420 is bonded to the die pad portion 210 of the second lead 200 by the solder 520.

The sealing resin 600 functions to cover and protect the semiconductor element 400, a portion of the first lead 100 and a portion of the second lead 200. The sealing resin 600 is formed of, for example, black epoxy resin and is molded by means of a mold (not shown). In this embodiment, a portion of the sealing resin 600, which is located in the z direction above a position where the first lead 100 and the second lead 200 protrude, has a flat truncated pyramidal shape. A projection 610 projecting downward in the z direction is formed in a lower portion of the sealing resin 600 in the z direction at a position interposed between the first terminal portion 170 of the first lead 100 and the second terminal portion 270 of the second lead 200.

As illustrated in FIGS. 1 and 5, the semiconductor device 101 has four holding portions 12. The four holding portions 12 are made of metal such as Cu, like the first lead 100 and the second lead 200. The four holding portions 12 are located at the same position in the z direction as the portions of the first lead 100 and the second lead 200 protruding from the sealing resin 600. The four holding portions 12 are separately arranged near the corners of the sealing resin 600 when viewed from the z direction. One of the y direction surfaces of each holding portion 12 is exposed from the sealing resin 600. The holding portions 12 serve to hold the sealing resin 600 in the process of manufacturing the semiconductor device 101.

As illustrated in FIG. 2, in this embodiment, a distance H1 between the transverse portion 130 of the first lead 100 and the upper electrode 410 of the semiconductor element 400 in the z direction is larger than a distance H2 between the transverse portion 130 and an outer surface of the sealing resin 600. For example, the distance H1 is about 0.43 mm and the distance H2 is about 0.15 mm. The thickness t of the transverse portion 130 is about 0.2 mm as described above.

Next, one example of a method of manufacturing the semiconductor device 101 will be described with reference to FIGS. 7 to 22.

Figure 7:
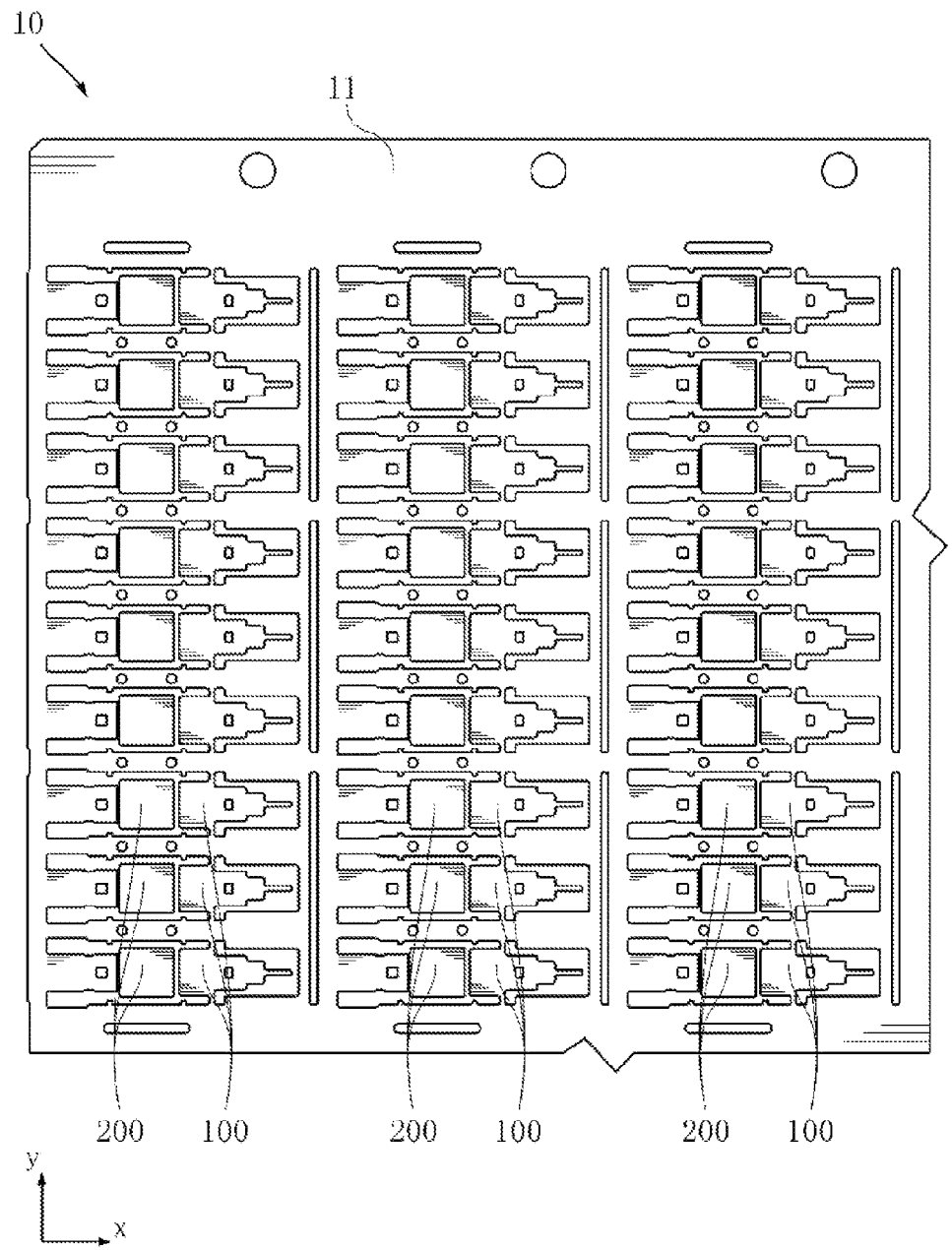
FIG. 7 is a plane view illustrating a lead frame used to manufacture the semiconductor device of FIG. 1.
Figure 8:
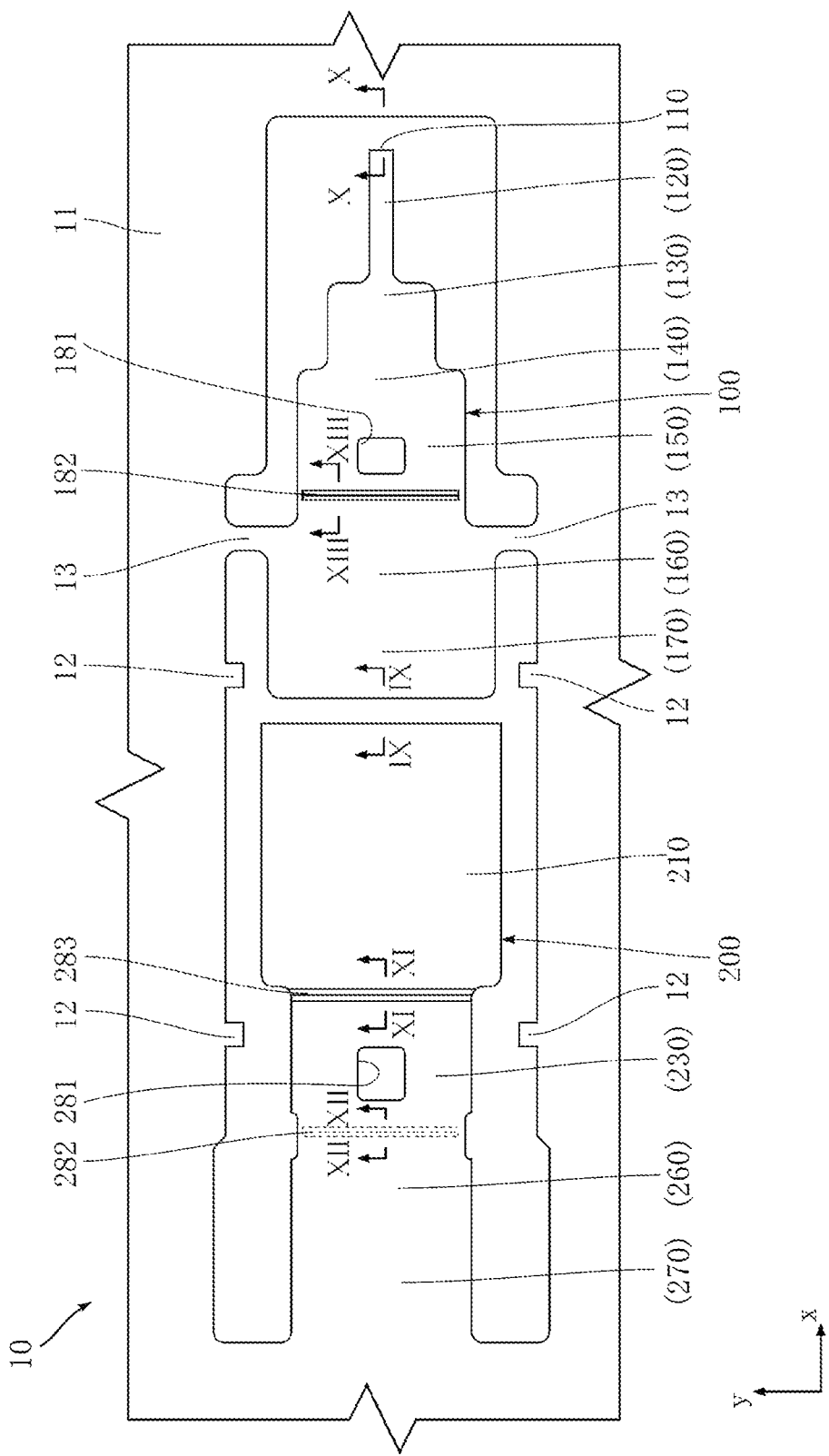
FIG. 8 is an enlarged plane view illustrating the lead frame of FIG. 7.

As illustrated in FIGS. 7 and 8, a lead frame 10 is first prepared. The lead frame 10 includes a frame 11 and a plurality of first leads 100 and second leads 200 supported by the frame 11. The lead frame 10 is formed of a metal plate made of, for example, Cu and its thickness is, for example, about 0.2 mm. As can be understood from FIG. 8, the first lead 100 and the second lead 200 shown in the figure are still flat rather than bent as in the earlier-mentioned first lead 100 and second lead 200. To be precise, the illustrated portions will be the first lead 100 and the second lead 200. However, in the following description, for the sake of convenience, they are respectively referred to as the first lead 100 and the second lead 200. Portions of the first lead 100 and the second lead 200 whose shapes are unclear in a stage before a bending operation is performed are denoted by reference numerals in parentheses. In the figures, for convenience of explanation, the x direction, the y direction and the z direction may be denoted under the presumption of completion of the semiconductor device 101.

As illustrated in FIG. 8, in the lead frame 10, the first lead 100 and the second lead 200 are arranged in a row in the x direction. The first lead 100 is connected to the frame 11 by two connecting portions 13. The two connecting portions 13 are connected to the vicinity of a portion of the first lead 100 to be the first bypass portion 160 and are spaced from each other in the y direction. Each connecting portion 13 is about 0.2 mm in the x direction dimension and about 0.3 mm in the y direction dimension.

The vicinity of a portion of the second lead 200 to be the second terminal portion 270 is connected to the frame 11.

Four holding portions 12 are formed per one set of the first lead 100 and the second lead 200. The four holding portions 12 protrude from the frame 11 in the y direction, with the first lead 100 and the second lead 200 interposed therebetween.

In this embodiment, the lead frame 10 is formed by punching a metal plate made of Cu. A die and a punch (not shown) are used for the punching operation. The die is disposed below the metal plate in the z direction and has a portion of the metal plate to be left as the lead frame 10 when viewed from the z direction, that is, a shape of the frame 11, the plurality of first leads 100 and the plurality of second leads 200. On the other hand, the punch has a shape of a portion of the metal plate to be removed to form the lead frame 10 when viewed from the z direction. The punch is pressed down in the z direction so as to intersect the die with the metal plate interposed therebetween. As a result, the metal plate is punched to obtain the lead frame 10.

Figure 9:
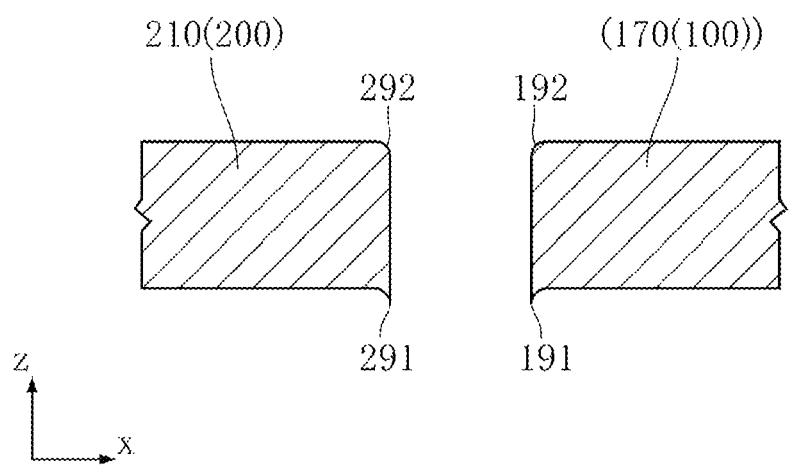
FIG. 9 is an enlarged sectional view taken along line IX-IX in FIG. 8.
Figure 10:
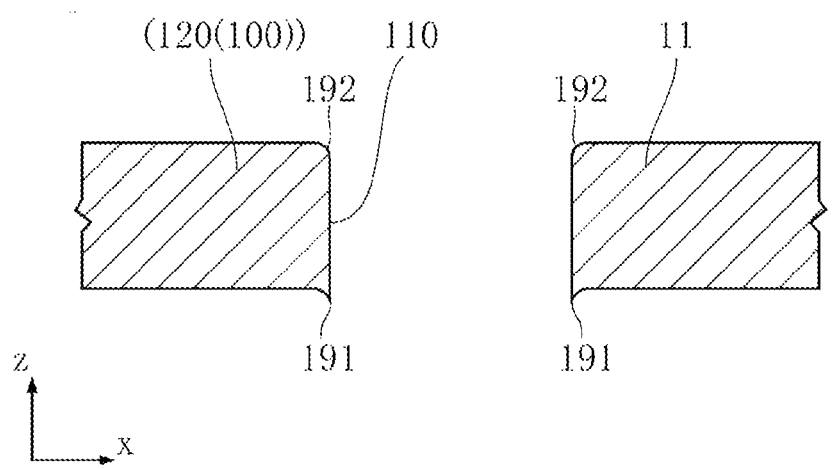
FIG. 10 is an enlarged sectional view taken along line X-X in FIG. 8.

As this punching operation is performed, there is a possibility that the first lead 100 has a first burr 191 and a first sagging 192 and the second lead 200 has a second burr 291 and a second sagging 292, as illustrated in FIGS. 9 and 10. As illustrated in these figures, the first sagging 192 and the second sagging 292 are formed in the upper side of the z direction toward which the punch is coming and the first burr 191 and the second burr 291 are formed in the lower side of the z direction. In the state shown in FIGS. 7 and 8, the orientation of the burrs 191 and 291 and the saggings 192 and 292 in the z direction is uniform. As described above, the burrs 191 and 291 and the saggings 192 and 292 may be formed during the process of manufacturing the semiconductor device 101. In the semiconductor device 101 manufactured through the punching operation, both of the burrs 191 and 291 and the saggings 192 and 292 may be formed, or one of them may be formed, or none of them may be formed.

Figure 12:
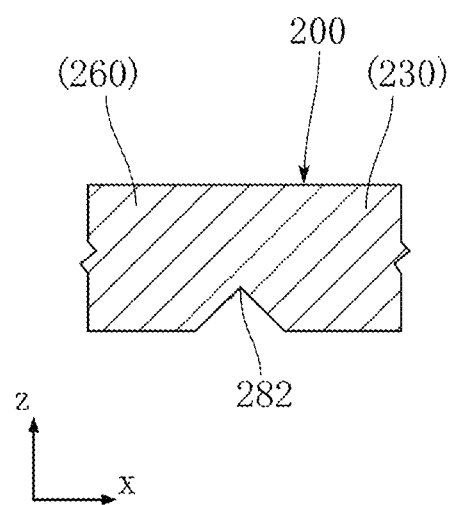
FIG. 12 is an enlarged sectional view taken along line XII-XII in FIG. 8.

A first groove 182 is formed in the first lead 100. The first groove 182 is formed between a portion to be the first extending portion 150 and a portion to be the first bypass portion 160. The first groove 182 has a triangular sectional shape having an opening in the upper side of the z direction, as illustrated in FIG. 13. However, the first groove 182 does not reach both ends of the first lead 100 in the y direction. A second groove 282 is formed in the second lead 200. The second groove 282 is formed between a portion to be the second extending portion 230 and a portion to be the second bypass portion 260. The second groove 282 has a triangular sectional shape having an opening in the lower side in the z direction, as illustrated in FIG. 12. The second groove 282 also does not reach both ends of the second lead 200 in the y direction. Accordingly, the first groove 182 and the second groove 282 have the opposite directions in which they are opened in the z direction. These grooves 182 and 282 may be formed at the same time as the punching operation, or may be formed before or after the punching operation. Alternatively, these grooves 182 and 282 may be formed between bending operations to be described later.

Figure 11:
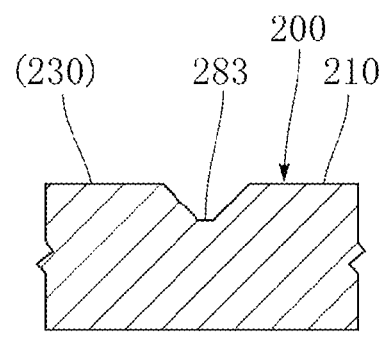
FIG. 11 is an enlarged sectional view taken along line XI-XI in FIG. 8.

A third groove 283 is formed in the second lead 200. The third groove 283 is formed between the die pad portion 210 and a portion to be the second extending portion 230. The third groove 283 has a triangular or trapezoidal sectional shape having an opening in the upper side of the z direction, as illustrated in FIG. 11. The third groove 283 reaches both ends of the second lead 200 in the y direction.

Figure 14:
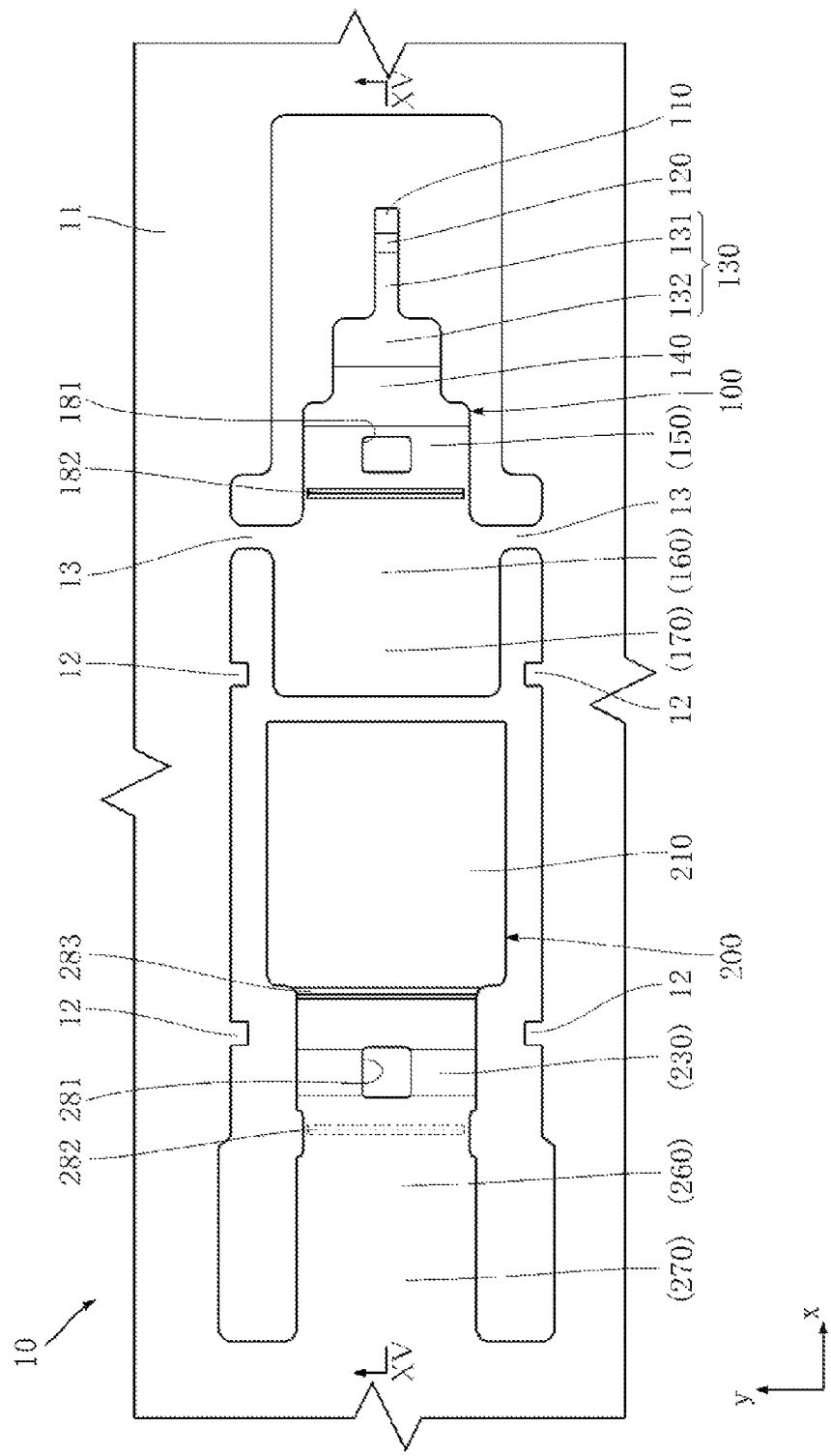
FIG. 14 is an enlarged plane view illustrating a state where a bending operation is performed for the lead frame used to manufacture the semiconductor device of FIG. 1.
Figure 15:
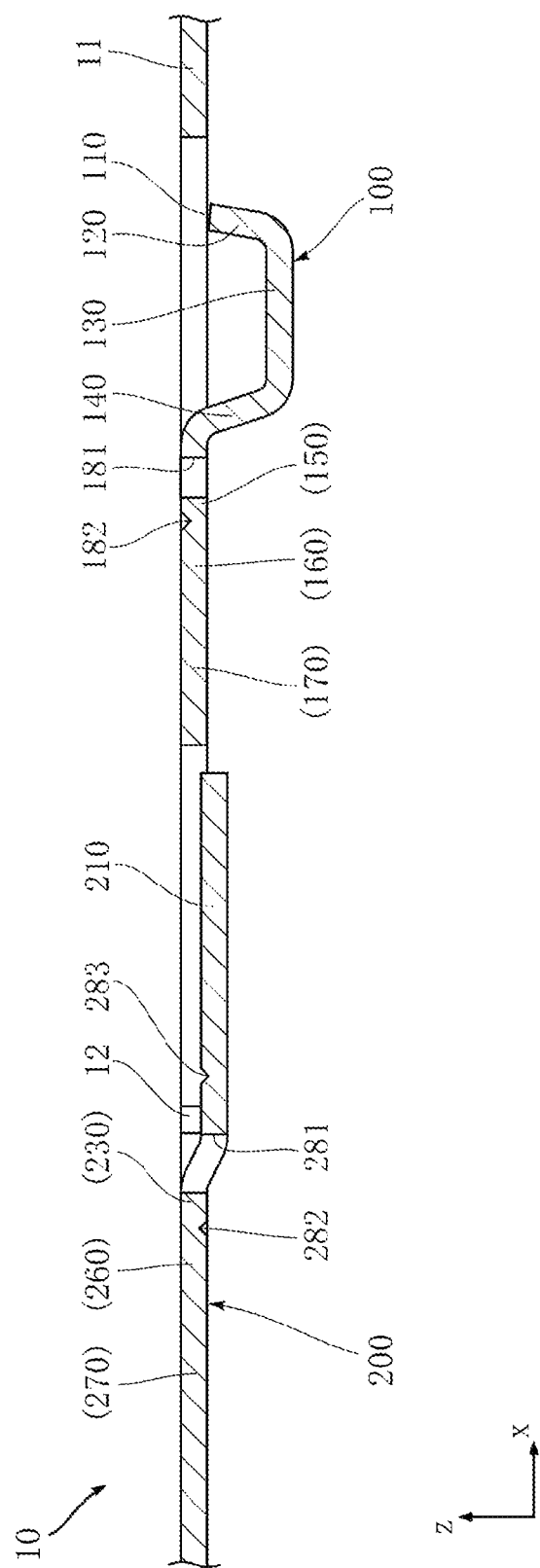
FIG. 15 is an enlarged sectional view taken along line XV-XV in FIG. 14.

Next, as illustrated in FIGS. 14 and 15, a bending operation is performed for the first lead 100 and the second lead 200. As for the first lead 100, the bending operation is performed for three sites from the end portion where the distal end surface 110 exists. Thus, the rising portion 120, the transverse portion 130 and the stepped portion 140 are formed. As for the second lead 200, the bending operation is performed for two sites from the end portion of the die pad portion 210. Thus, a portion that will become the second extending portion 250 having a crank shape is formed. Due to this bending operation, the die pad portion 210 is moved downward in the z direction with respect to the frame 11. The first lead 100 has a posture in which the distal end surface 110 faces upward in the z direction.

Figure 16:
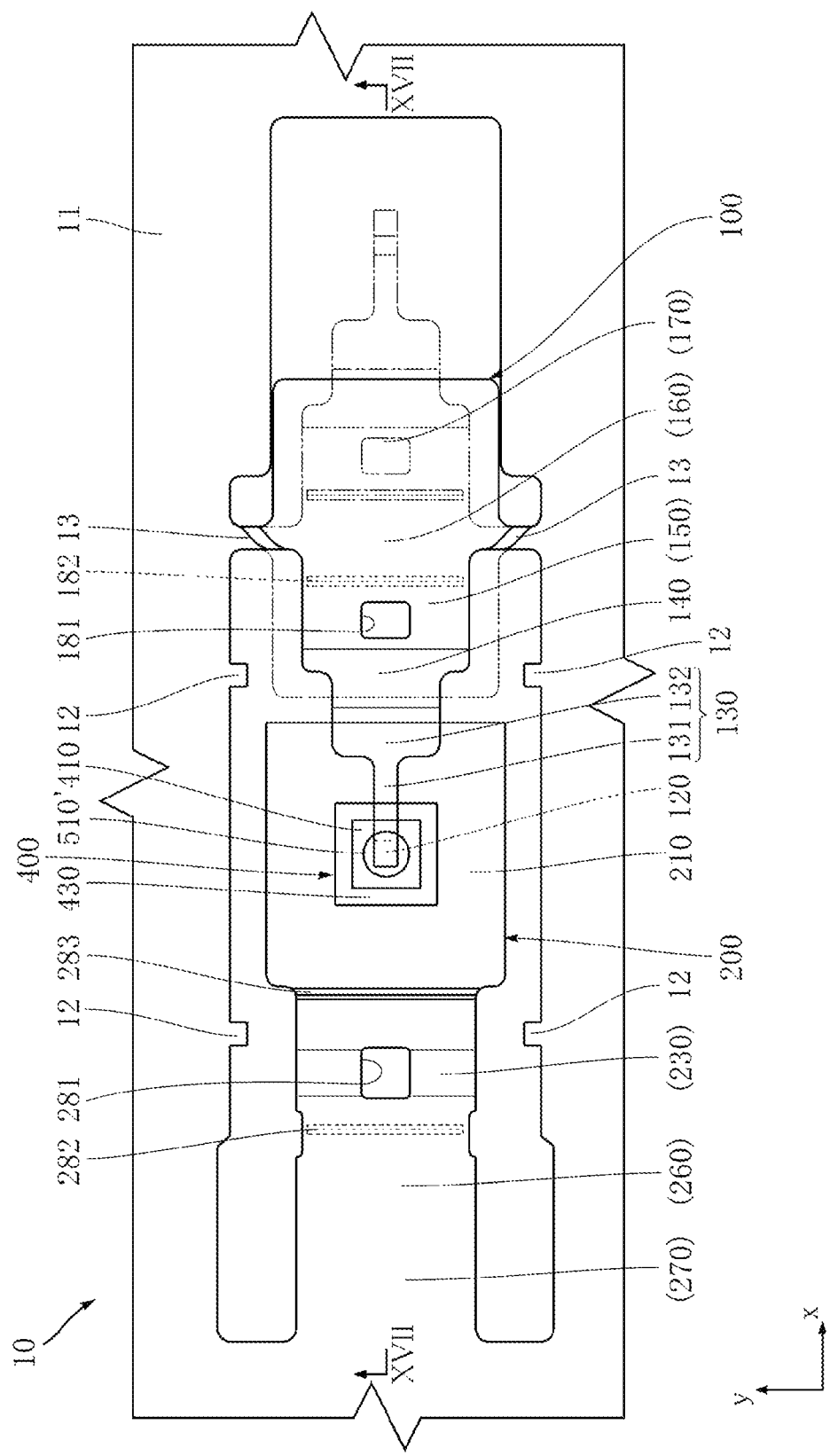
FIG. 16 is an enlarged plane view illustrating a state where a reversing operation is performed for the lead frame used to manufacture the semiconductor device of FIG. 1.
Figure 17:
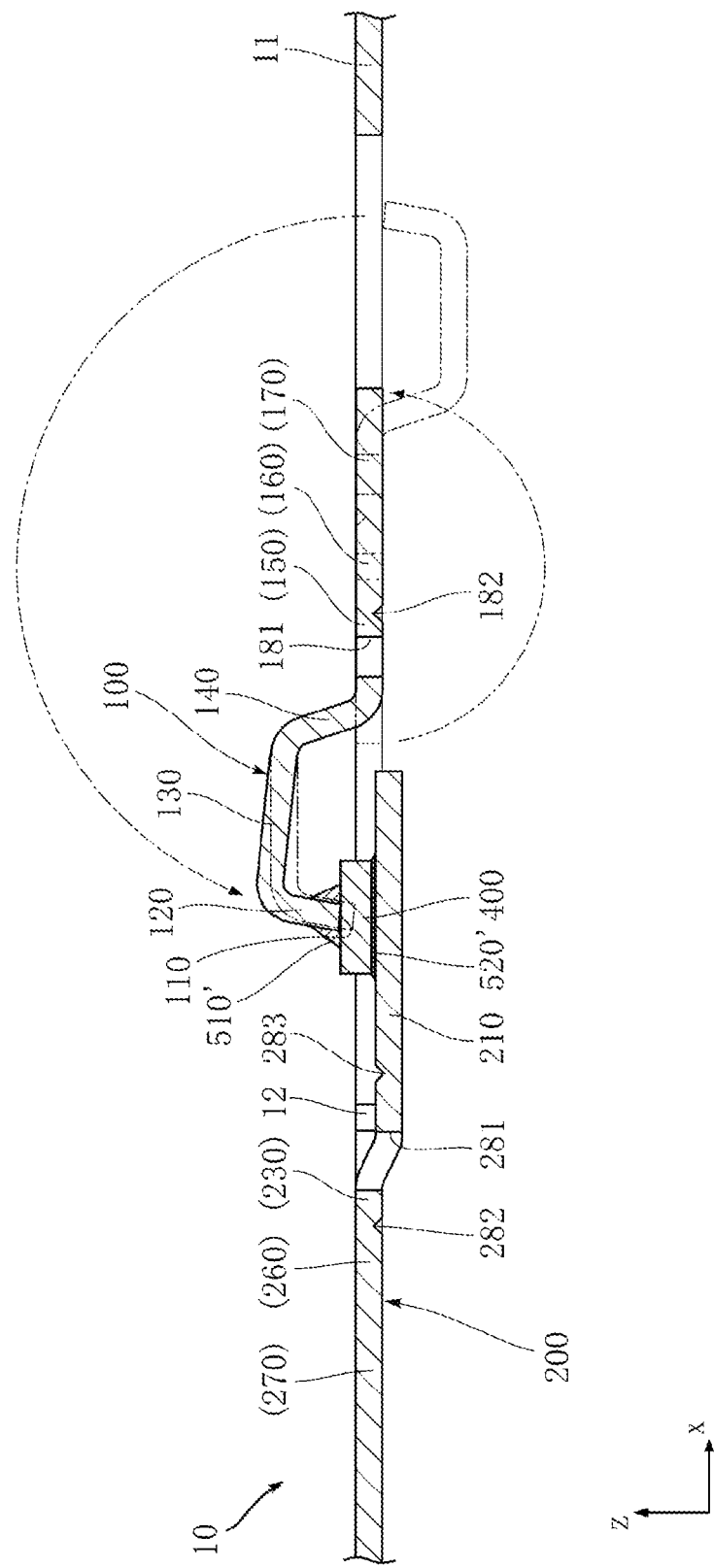
FIG. 17 is an enlarged sectional view taken along line XVII-XVII in FIG. 16.

Next, as illustrated in FIGS. 16 and 17, the semiconductor element 400 is mounted on the die pad portion 210. Specifically, a solder paste 520' to be the above-mentioned solder 520 is first applied on the die pad portion 210 and the semiconductor element 400 is mounted thereon. In addition, a solder paste 510' to be the above-mentioned solder 510 is applied on the upper electrode 410 of the semiconductor element 400. The solder paste 510' is applied on a region sufficiently recessed inwardly from the outer edge of the upper electrode 410 in the vicinity of the center of the upper electrode 410. Then, the first lead 100 is rotated by about 180 degrees counterclockwise in FIG. 17 about an axis extending in the y direction through the two connecting portions 13. Accordingly, the two connecting portions 13 are twisted by 180 degrees. In addition, the posture in which the distal end surface 110 faces upward in the z direction turns to a posture in which the distal end surface 110 faces the upper electrode 410 of the semiconductor element 400.

When the first lead 100 is rotated by 180 degrees, the distal end surface 110, the rising portion 120 and the transverse portion 130 of the first lead 100 is located at a position indicated by an imaginary line in the vicinity of the semiconductor element 400 in FIG. 17. However, as the distal end surface 110 contacts the upper electrode 410, the transverse portion 130 or its neighborhood of the first lead 100 is slightly deflected. As a result, the rising portion 120 is inclined with respect to the z direction and the distal end surface 110 and the transverse portion 130 are inclined with respect to the x direction. At this time, a portion of the distal end surface 110 in active contact with the upper electrode 410 corresponds to a portion where the first sagging 192 is formed as illustrated in FIG. 3. Thereafter, for example, the solder pastes 510' and 520' are cured by heating. Thus, the solders 510 and 520 are formed to complete the bonding of the distal end surface 110 of the first lead 100 to the upper electrode 410 and the bonding of the die pad portion 210 of the second lead 200 to the lower electrode 420.

Figure 18:
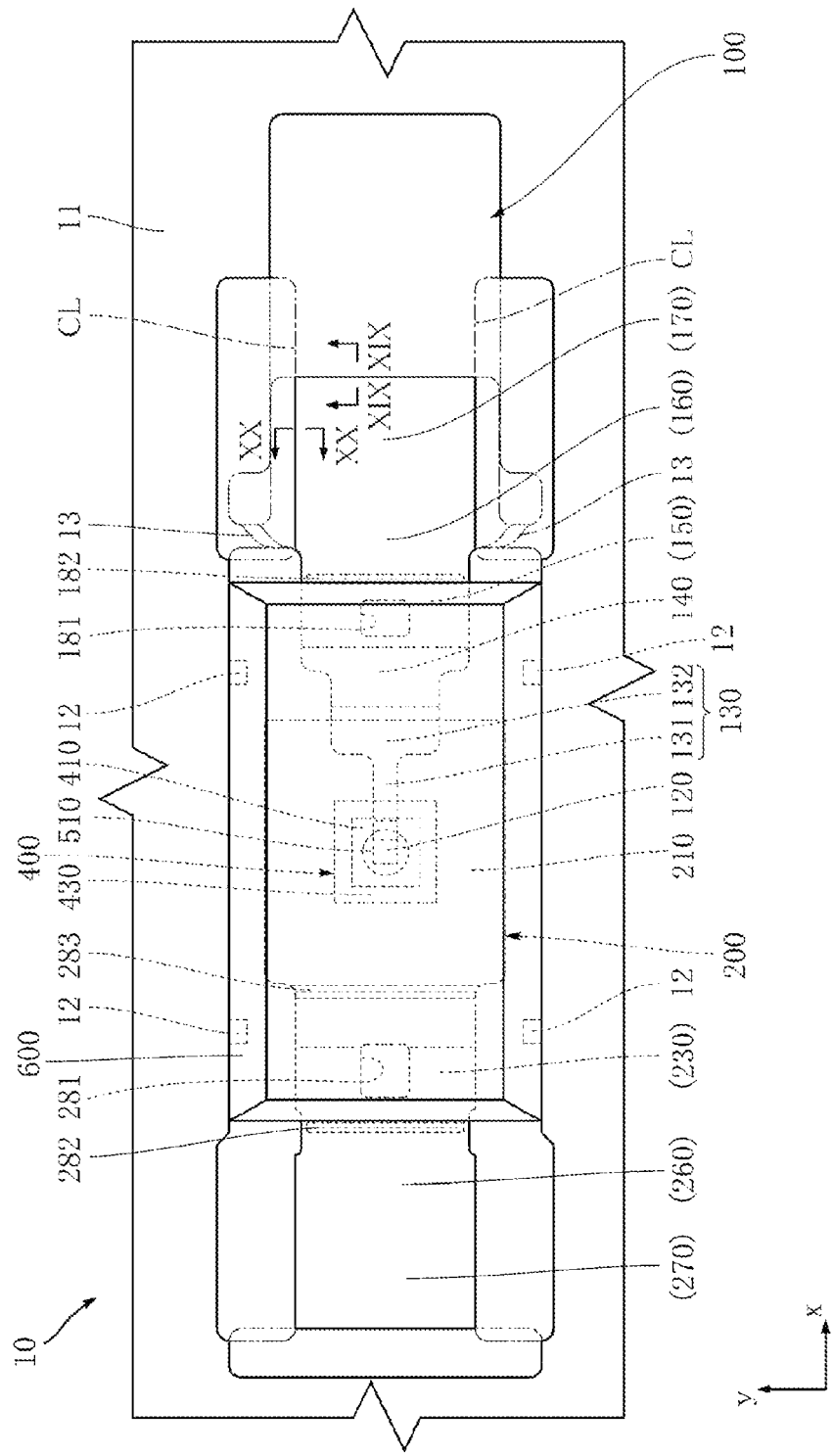
FIG. 18 is an enlarged plane view illustrating a state where a punching operation is performed for the lead frame used to manufacture the semiconductor device of FIG. 1.

Next, as illustrated in FIG. 18, the sealing resin 600 is formed. For example, the sealing resin 600 is molded using a mold (not shown) having cavity accommodating portions of the first lead 100 and the second lead 200. The four holding portions 12 are accommodated in the cavity. The sealing resin 600 is obtained by filling the cavity with a resin material such as epoxy resin and curing the resin material.

Next, a region surrounded by two cutting lines CL in FIG. 18 is removed by punching. The region surrounded by the cutting lines CL includes the connecting portions 13, a portion of the first lead 100 and a portion of the frame 11. In this embodiment, the region surrounded by the cutting lines CL is about 2.3 mm in the x direction dimension and about 0.6 mm in the y direction dimension. The two connecting portions 13 are removed by this punching, thereby making portions to be the first bypass portion 160 and the first terminal portion 170 of the first lead 100.

The punching of the region surrounded by the cutting lines CL is performed using a die and a punch (not shown), like the above-described punching operation. In this case, a shape of the punch viewed from the z direction corresponds to a shape of the region surrounded by the cutting lines CL. The die has a shape having an opening into which the punch can be inserted. The die is disposed below the lead frame 10 in the z direction and the punch is pressed down from above in the z direction. As a result, the first burr 191 and the first sagging 192 are formed in edges of the first lead 100 formed by the punching operation. That is, as illustrated in FIG. 20, in the edge of a portion to be the first terminal portion 170 of the first lead 100 in the y direction, the first burr 191 is formed in the lower side of the z direction and the first sagging 192 is formed in the upper side of the z direction. On the other hand, as illustrated in FIG. 19, in the edge of a portion to be the first terminal portion 170 of the first lead 100 in the x direction, the first burr 191 is formed in the upper side of the z direction and the first sagging 192 is formed in the lower side of the z direction. This is because the first lead 100 having the first burr 191 and the first sagging 192 described with reference to FIGS. 8 to 10 takes the posture vertically inverted by the rotation operation described with reference to FIG. 17. Thus, the first lead 100 has a portion where positions of the first burr 191 and the first sagging 192 are opposite to each other in its thickness direction.

Figure 21:
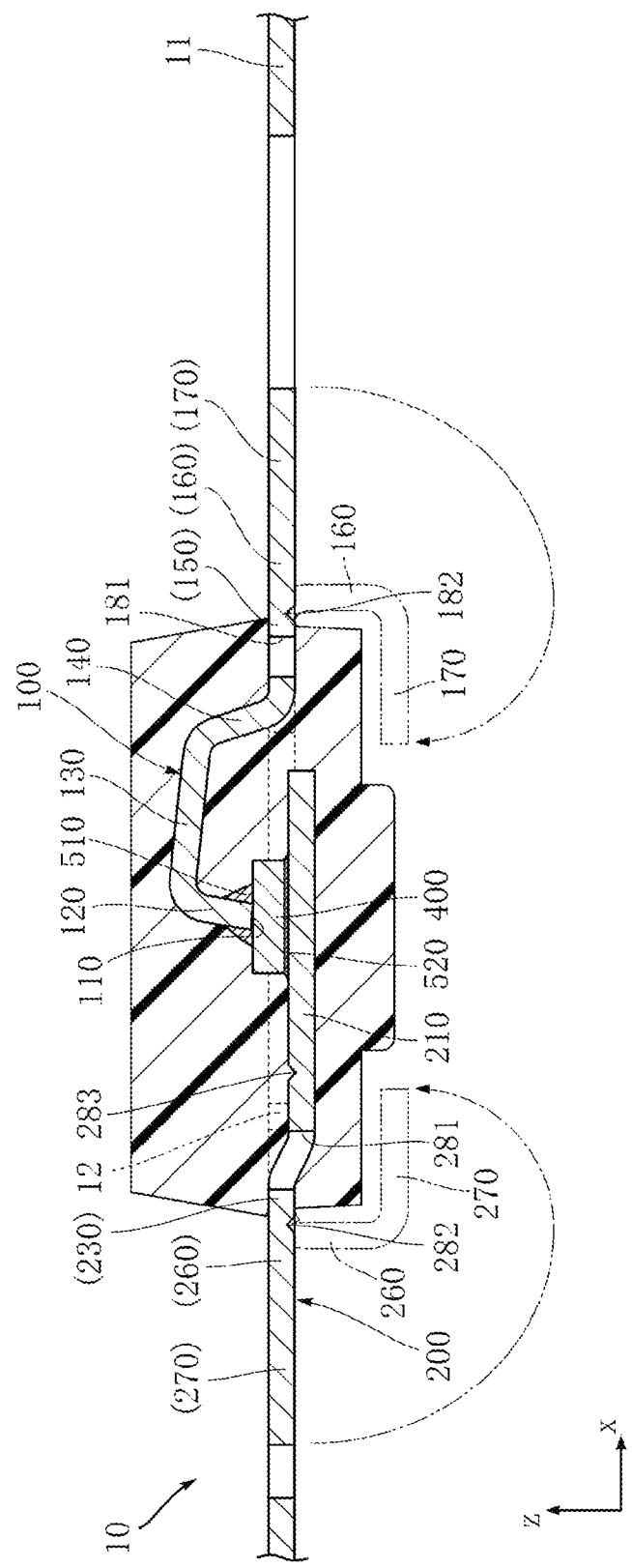
FIG. 21 is an enlarged plane view illustrating a state where a bending operation is performed for the lead frame used to manufacture the semiconductor device of FIG. 1.

Next, as illustrated in FIG. 18, a portion connecting the second lead 200 and the frame 11 is removed. This removal may be performed at the same time of the punching operation to remove the region surrounded by the cutting lines CL in FIG. 18. As a result, the first lead 100 and the second lead 200 are separated from the frame 11. However, the sealing resin 600 covers the four holding portions 12 extending from the frame 11. Accordingly, the sealing resin 600 remains held in the frame 11. In addition, the first lead 100 and the second lead 200 also remain held in the frame 11 through the sealing resin 600. Also, as illustrated in FIG. 21, a bending operation is performed on two portions of the first lead 100 and the second lead 200 protruding from the sealing resin 600. Thus, the bypass portions 160 and 260 and the terminal portions 170 and 270 are formed. At this time, the first groove 182 and the second groove 282 serve as bending start positions. Although the first groove 182 in FIGS. 8 and 13 is opened upward in the z direction, it is opened downward in the z direction after being subjected to the rotation operation, like the second groove 282. Thereafter, the semiconductor device 101 shown in FIG. 1 is obtained by performing a punching operation or a cutting operation to separate the four holding portions 12 from the frame 11.

Figure 22:
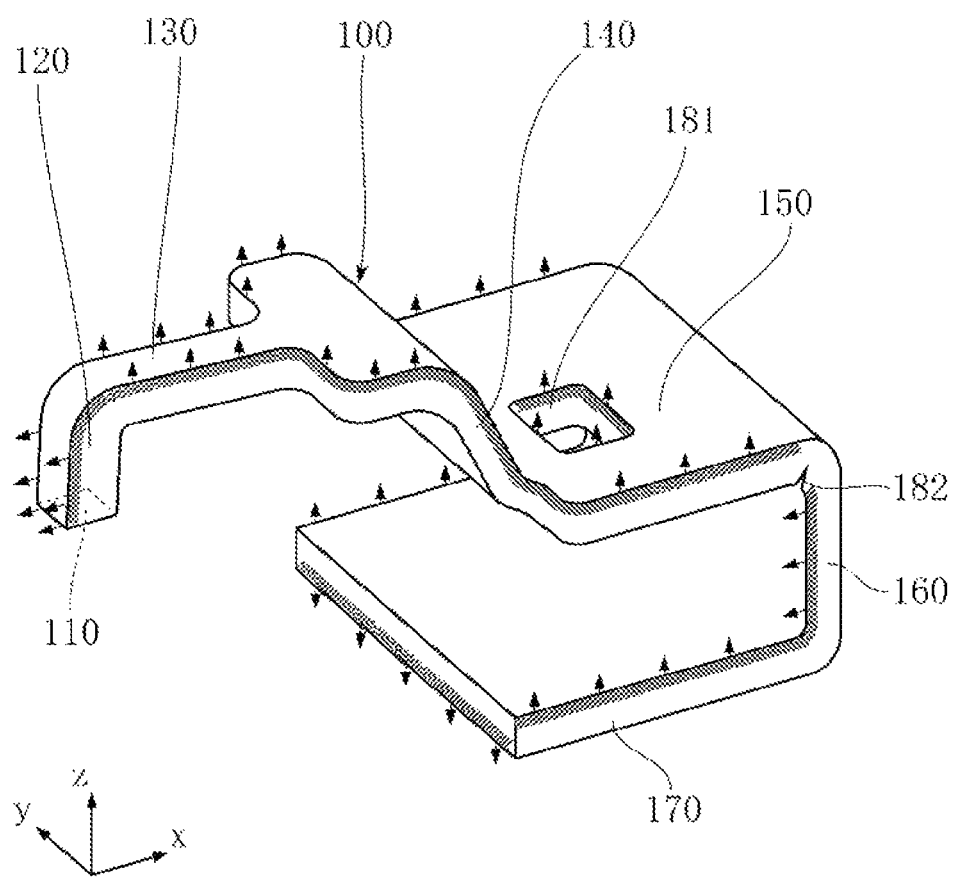
FIG. 22 is a perspective view illustrating a first lead of the semiconductor device of FIG. 1.

FIG. 22 is a perspective view showing a single first lead 100 formed through the above-described manufacturing process. In the figure, a belt-like portion with halftone is a portion where a fracture surface is formed. The fracture surface is a trace of a portion where the first lead 100 and the second lead 200 are torn off after a shearing procedure in the punching operation in the above-described manufacturing process. In each portion of the first lead 100 and the second lead 200, the fracture surface appears on one side in the thickness direction. From the principle of a punching operation, the above-mentioned first burr 191 may occur on the side where the fracture surface exists. In this figure, small arrows represent portions where the first burr 191 is formed. As described above, the first lead 100 is subjected to the punching operation twice, with the rotation operation to reverse the first lead 100 performed therebetween. Accordingly, there exist two portions having the fracture surface and the first burr 191 which are opposite to each other in the thickness direction. For the edges of the first bypass portion 160 and the first terminal portion 170 in the y direction, which are formed by the second punching, a portion where the fracture surface and the first burr 191 are formed is opposite to the other portions.

Next, some effects of the semiconductor device 101 and the method of manufacturing the same will be described.

According to this embodiment, as illustrated in FIGS. 1, 2 and 5, the first lead 100 is bonded by the solder 510 with the posture where only the distal end surface 110 faces the upper electrode 410. Therefore, it is possible to prevent the softened solder from spreading over an extended region when the upper electrode 410 and the first lead 100 are bonded to each other in the process of manufacturing the semiconductor device 101. Thus, it is possible to prevent the first lead 100 from being misaligned and prevent the solder 510 from extending to the side of the semiconductor element 400 over the upper electrode 410. In addition, by providing the rising portion 120 rising from the upper electrode 410, it can be expected that the softened solder rises along the rising portion 120. Thus, the solder 510 can stay in the vicinity of the rising portion 120. Accordingly, it is possible to bond the upper electrode 410 of the semiconductor element 400 to the first lead 100 more reliably.

In addition, by making the distal end surface 110 smaller than the upper electrode 410 of the semiconductor element 400, the solder 510 can stay in a narrower region. Overlapping the distal end surface 110 with the center of the upper electrode 410 of the semiconductor element 400 when viewed from the z direction is appropriate to prevent the solder 510 from spreading over the upper electrode 410. When the solder 510 is contained in the upper electrode 410 when viewed from the z direction, unintended electrical connection of the solder 510 with the side of the semiconductor element 400 can be eliminated. By making the outer shape of the semiconductor element 400 similar to the upper electrode 410 when viewed from the z direction, it is possible to decrease a variation of a distance between the edge of the upper electrode 410 and the edge of the semiconductor element 400, while providing a relatively large area of the upper electrode 410. If the distal end surface 110 has a square shape, it is generally convenient to make the shape of the distal end surface 110 similar to the shape of the upper electrode 410 of the semiconductor element 400.

As the first lead 100 has the transverse portion 130, a projection from the sealing resin 600 for making electrical connection of the first lead 100 with an external component (not shown) can be provided at a position spaced from the semiconductor element 400 in the x direction. This facilitates a decrease in the height of the semiconductor device 101. In addition, by making the distance H1 larger than the distance H2 in FIG. 2, the climbing height of the solder 510 to the rising portion 120 can be further increased. This is appropriate to retain the solder 510 in a smaller region. In addition, this contributes to a decrease in the height of the sealing resin 600 and is appropriate to decrease the height of the semiconductor device 101.

By providing the stepped portion 140, a portion of the first lead 100 can be located at the height close to the semiconductor element 400 in the lower side in the z direction from the transverse portion 130 traversing over the semiconductor element 400 in the z direction. In addition, as the first extending portion 150 connected to the stepped portion 140 extends to the right side in the x direction and protrudes from the sealing resin 600, the first lead 100 can be located at a height close to the semiconductor element 400. This has an advantage that the position at which the first lead 100 protrudes from the sealing resin 600 is not biased while reducing the height of the sealing resin 600.

By providing the first bypass portion 160 and the first terminal portion 170, the semiconductor device 101 can be configured as a so-called surface-mounting type.

As the first groove 182 is formed in the bent portion which is the portion connecting the first extending portion 150 and the first bypass portion 160, the first lead 100 can be bent at a position separated reliably from the sealing resin 600. While separating the first groove 182 from the sealing resin 600, by appropriately decreasing a distance between the first groove 182 and the sealing resin 600, the semiconductor device 101 can be made more compact. In addition, as the first groove 182 is shorter than the bent portion in the y direction and does not reach both ends of the first lead 100 in the y direction, it is possible to prevent the bent portion from being unduly weakened.

As the transverse portion 130 has the equal width part 131, the bent portion between the transverse portion 130 and the rising portion 120 can be precisely bent. In addition, as the transverse portion 130 has the extended width part 132, the transverse portion 130 can have appropriate high rigidity and low resistance.

As the rising portion 120 is inclined with respect to the z direction, the first burr 191 is formed in a portion of the distal end surface 110 opposite to the side where the rising portion 120 is inclined (the left side in FIG. 3). Thus, the first burr 191 can be spaced from the upper electrode 410 of the semiconductor element 400. Therefore, it is possible to prevent the upper electrode 410 from being damaged by the first burr 191. It is also possible to prevent only the first burr 191 from contacting the upper electrode 410 and the distal end surface 110 from being spaced from the upper electrode 410. In addition, the first sagging 192 may be easily formed in the opposite side to the side where the first burr 191 is formed. As this portion has a positional relationship closer to the upper electrode 410 than the first burr 191, the distal end surface 110 can be more reliably contacted with the upper electrode 410.

By providing the die pad portion 210 bonded to the semiconductor element 400 from the opposite side to the distal end surface 110 of the first lead 100, the semiconductor element 400 can be more reliably held. By providing the second extending portion 230, the projection 610 protruding from the sealing resin 600 for electrical connection of the second lead 200 with an external component (not shown) can be provided at a position spaced from the semiconductor element 400 in the x direction. This facilitates reduction in the height of the semiconductor device 101. By providing the second bypass portion 260 and the second terminal portion 270, the semiconductor device 101 can be configured as a so-called surface-mounting type.

As the second groove 282 is formed in the bent portion which is the portion connecting the second extending portion 250 and the second bypass portion 260, the second lead 200 can be bent at a position separated reliably from the sealing resin 600. While separating the second groove 282 from the sealing resin 600, by appropriately decreasing a distance between the second groove 282 and the sealing resin 600, the semiconductor device 101 can be made more compact. In addition, as the second groove 282 is shorter than the bent portion in the y direction and does not reach both ends of the second lead 200 in the y direction, it is possible to prevent the bent portion from being unduly weakened.

The method of manufacturing the semiconductor device 101 includes a process of arranging the first lead 100 such that the upper electrode 410 faces the distal end surface 110, and a process of bonding the upper electrode 410 to the distal end surface 110. Thus, it is not necessary to face a portion of the first lead 100 having a relatively large area similar to the die pad portion 210 to the upper electrode 410. This is suitable for suppressing displacement of the semiconductor element 400 and spread of the solder 510.

In the process of arranging the first lead 100, the first lead 100 is rotated to have the posture where the distal end surface 110 faces the upper electrode 410, which is changed from the posture where the distal end surface 110 faces upward in the z direction. Thus, it is not necessary to arrange the first lead 100 on the semiconductor element 400 through an operation such as sliding the first lead 100 from a position spaced from the semiconductor element 400. Therefore, the first lead 100 can be arranged on the semiconductor element 400 with more ease and reliability. In addition, in the process of arranging the first lead 100, while rotating the first lead 100 by twisting the connecting portions 13, the connecting portions 13 are removed after the process of arranging the first lead 100. Thus, the first lead 100 can be stably rotated about the connecting portions 13 and the distal end surface 110 of the first lead 100 can be led to a position opposite the upper electrode 410. By removing the connecting portions 13, it is possible to prevent an unduly protruding portion from being formed in the semiconductor device 101.

Figure 23:
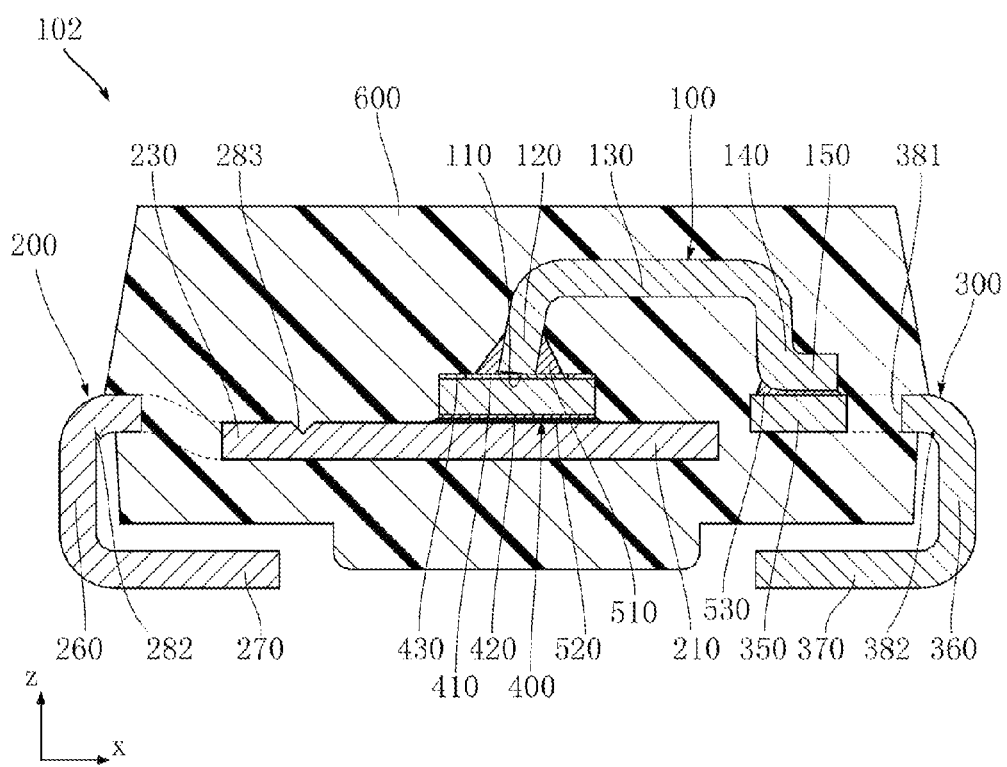
FIG. 23 is a sectional view illustrating a semiconductor device according to a second embodiment of the present disclosure.

FIG. 23 illustrates a second embodiment of the present disclosure. In this figure, elements identical or similar to those in the earlier-described first embodiment are denoted by the same reference numerals. A semiconductor device 102 shown in this figure includes a third lead 300.

In the second embodiment, the first lead 100 includes the distal end surface 110, the rising portion 120, the transverse portion 130, the stepped portion 140 and the first extending portion 150 but does not include the first bypass portion 160 and the first terminal portion 170. In addition, the second embodiment is different from the earlier-described first embodiment in that the first extending portion 150 protrudes from the sealing resin 600. The distal end surface 110, the rising portion 120, the transverse portion 130 and the stepped portion 140 of the first lead 100 have the same configuration as those in the earlier-described first embodiment.

The third lead 300 makes electrical connection with the first lead 100 and defines an electrical conductive path to the semiconductor element 400 in series to the first lead 100. The third lead 300 includes a third extending portion 350, a third bypass portion 360 and a third terminal portion 370. The third lead 300 is formed of a metal plate made of Cu and has a thickness of, for example, about 0.2 mm. The third extending portion 350 is parallel to the x direction and is bonded to the first extending portion 150 of the first lead 100 by, for example, solder 530. The third bypass portion 360 and the third terminal portion 370 have the same configuration as the first bypass portion 160 and the first terminal portion 170 in the earlier-described first embodiment. In addition, the third lead 300 has a third opening 381 and a third groove 382, like the first lead 100.

When the semiconductor device 102 is formed, after mounting the semiconductor element 400 on the second lead 200, the first lead 100 already formed by the bending operation is arranged to span over the upper electrode 410 of the semiconductor element 400 and the third extending portion 350 of the third lead 300. Then, for example, the bonding is completed by curing the solder paste.

According to the second embodiment, the upper electrode 410 of the semiconductor element 400 and the first lead 100 can be bonded together more reliably.

The semiconductor device and the method of manufacturing the same according to the present disclosure are not intended to be limited to the embodiments described above. Specific configurations of the semiconductor device and the method of manufacturing the same according to the present disclosure may be varied in various ways.

Although the distal end surface and the electrode recited in the present disclosure are in some embodiments in reliable contact, both may be separated from each other if bonding and electrical connection by a conductive bonding material are guaranteed. Although the square or rectangular shape of the distal end surface is useful in forming the first lead from the metal plate, without being limited thereto, it may have, for example, a circular shape appropriately depending on a shape of the electrode. The first lead may have a plurality of distal end surfaces and rising portions. A plurality of distal end surfaces may be configured to face a single electrode. Alternatively, a plurality of electrodes having the same side that the semiconductor element faces may be configured to face the respective distal end surfaces. In addition, a plurality of first leads may be configured to be bonded to a single semiconductor element. The semiconductor element recited in the present disclosure is not limited to a diode but may be other elements such as a transistor, an LED and the like.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a semiconductor element having an electrode facing a first direction;
   a first lead having a conductive distal end surface facing the electrode, and a rising portion which is connected to the distal end surface to extend away from the electrode;
   a conductive bonding material bonding the electrode of the semiconductor element to the distal end surface of the first lead; and
   a sealing resin covering the semiconductor element, at least a portion of the first lead, and the conductive bonding material,
   wherein the rising portion is inclined with respect to the first direction, and
   wherein a burr is formed in a portion of the distal end surface in an opposite side to a direction to which the rising portion is inclined.

2. The semiconductor device of claim 1, wherein the distal end surface is smaller than the electrode of the semiconductor element when viewed from the first direction.

3. The semiconductor device of claim 2, wherein the distal end surface overlaps with a center of the electrode of the semiconductor element.

4. The semiconductor device of claim 2, wherein the conductive bonding material is contained in the electrode when viewed from the first direction.

5. The semiconductor device of claim 2, wherein an outline of the semiconductor element is similar to that of the electrode when viewed from the first direction.

6. The semiconductor device of claim 2, wherein the distal end surface has a rectangular shape.

7. The semiconductor device of claim 1, wherein the first lead has a transverse portion that is connected to the rising portion to extend to be spaced away from the rising portion when viewed from the first direction.

8. The semiconductor device of claim 7, wherein a distance between the transverse portion and the electrode of the semiconductor element in the first direction is larger than a distance between the transverse portion and an outer surface of the sealing resin in the first direction.

9. The semiconductor device of claim 7, wherein the first lead further has a stepped portion having one end connected to the transverse portion in an opposite side to the rising portion and the other end located nearer to the semiconductor element in the first direction than the one end.

10. The semiconductor device of claim 9, wherein the first lead further has a first extending portion which is connected to the stepped portion and extends to be spaced away from the stepped portion when viewed from the first direction, and wherein the first extending portion has a portion protruding from the sealing resin.

11. The semiconductor device of claim 10, wherein the first lead further has a first bypass portion having one end connected to the first extending portion in an opposite side to the stepped portion and the other end located at a position spaced from the stepped portion in the first direction below the one end.

12. The semiconductor device of claim 11, wherein the first lead further has a first groove which is formed in a first bent portion connecting the first extending portion and the first bypass portion and extends in a bending direction of the first bent portion, with the first groove located in an inner side of the first bent portion.

13. The semiconductor device of claim 12, wherein the first groove is shorter than the bent portion in the bending direction.

14. The semiconductor device of claim 11, wherein the first lead further has a first terminal portion connected to the first bypass portion.

15. The semiconductor device of claim 7, wherein the transverse portion has an equal width portion whose width of one side connected to the rising portion is equal to the width of the rising portion.

16. The semiconductor device of claim 15, wherein the transverse portion further has an extended width portion which is connected to the equal width portion in an opposite side to the rising portion and is wider than the equal width portion.

17. The semiconductor device of claim 10, wherein the transverse portion has an equal width portion whose width of one side connected to the rising portion is equal to the width of the rising portion and an extended width portion which is connected to the equal width portion in an opposite side to the rising portion and is wider than the equal width portion, and wherein the first extending portion is wider than the extended width portion.

18. The semiconductor device of claim 1, further comprising a second lead having a die pad portion bonded to the semiconductor element from an opposite side to the distal end surface of the first lead.

19. The semiconductor device of claim 18, further comprising a second extending portion which is connected to the die pad portion and extends to an outside of the sealing resin when viewed from the first direction.

20. The semiconductor device of claim 19, wherein the second extending portion of the second lead is located such that a portion connected to the die pad portion is farther spaced from the distal end surface of the first lead in the first direction than a portion protruding from the sealing resin.

21. The semiconductor device of claim 19, wherein the second extending portion has a width that is narrower than that of the die pad portion.

22. The semiconductor device of claim 19, wherein the second lead has a second bypass portion having one end connected to the second extending portion in an opposite side to the die pad portion and the other end located at a position spaced from the second extending portion in the first direction below the one end.

23. The semiconductor device of claim 22, wherein the second lead has a second groove which is formed in a second bent portion connecting the second extending portion and the second bypass portion and extends in a bending direction of the second bent portion, with the second groove located in an inner side of the second bent portion.

24. The semiconductor device of claim 23, wherein the second groove is shorter than the second bent portion in the bending direction.

25. The semiconductor device of claim 22, wherein the second lead further has a second terminal portion connected to the second bypass portion.

* * * * *